(12) United States Patent
Morozumi et al.

(10) Patent No.: US 9,065,051 B2
(45) Date of Patent: Jun. 23, 2015

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Koichi Morozumi, Shiojiri (JP); Akira Kuriki, Shiojiri (JP); Ichiro Asaoka, Suwa (JP); Sayaka Kimura, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/301,596

(22) Filed: Jun. 11, 2014

(65) Prior Publication Data

US 2014/0368583 A1 Dec. 18, 2014

(30) Foreign Application Priority Data

Jun. 12, 2013 (JP) .................................. 2013-124135
Jun. 10, 2014 (JP) .................................. 2014-120023

(51) Int. Cl.
*B41J 2/045* (2006.01)
*H01L 41/187* (2006.01)
*B41J 2/14* (2006.01)

(52) U.S. Cl.
CPC ......... *H01L 41/1876* (2013.01); *B41J 2/14201* (2013.01)

(58) Field of Classification Search
CPC ................... B41J 2/14201; B41J 2002/14241; B41J 2002/14258; H01L 41/87; H01L 41/1876; H01L 41/18; H01L 41/047; H01B 1/08; H01C 7/043; C04B 2235/3224
See application file for complete search history.

(56) References Cited

U.S. PATENT DOCUMENTS

| 7,567,022 B2 * | 7/2009 | Fukui et al. .................... 310/358 |
| 2011/0164096 A1 * | 7/2011 | Nawano .......................... 347/71 |

FOREIGN PATENT DOCUMENTS

| JP | 2005-340428 A | 12/2005 | |
| JP | 2011-238774 A | 11/2011 | |
| WO | WO 2010/013438 A1 * | 2/2010 | ............... B41J 2/045 |

* cited by examiner

*Primary Examiner* — Geoffrey Mruk
(74) *Attorney, Agent, or Firm* — Harness, Dickey & Pierce, P.L.C.

(57) ABSTRACT

A liquid ejecting head includes a piezoelectric element including a first electrode, a piezoelectric layer overlying the first electrode with an orientation control layer therebetween, and a second electrode overlying the piezoelectric layer. The piezoelectric layer is made of a complex oxide having a perovskite structure including an A site containing lead and a B site containing zirconium and titanium. The orientation control layer is made of a complex oxide having a perovskite structure including an A site containing lanthanum and a B site containing nickel and titanium.

11 Claims, 16 Drawing Sheets

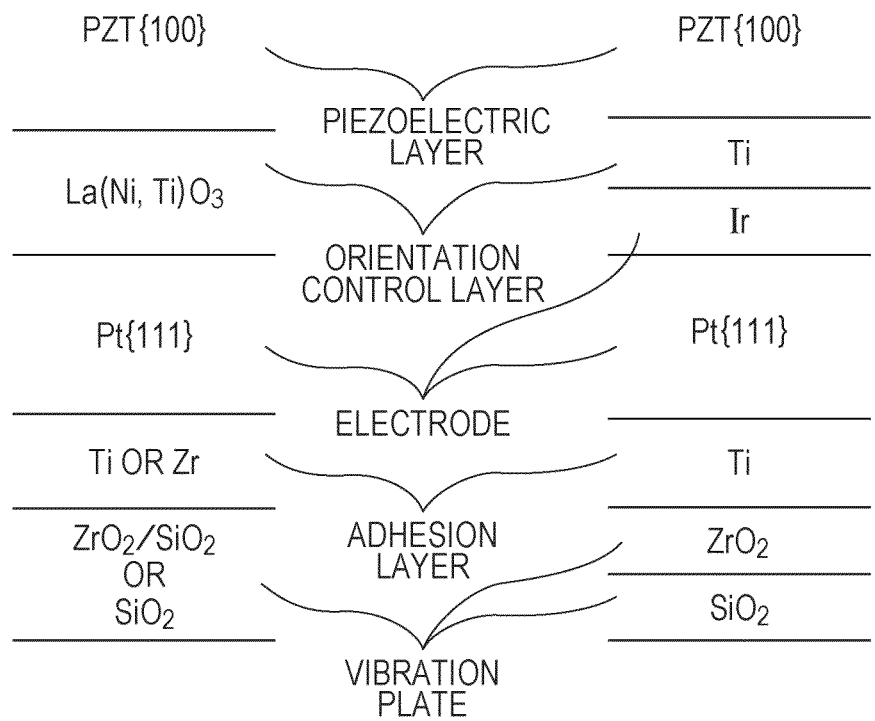

LIQUID EJECTING HEAD, LIQUID
EJECTING APPARATUS, AND
PIEZOELECTRIC ELEMENT

BACKGROUND

1. Technical Field

The present invention relates to a liquid ejecting head and a liquid ejecting apparatus that each include a piezoelectric element including a piezoelectric layer made of a piezoelectric material and electrodes, and that eject droplets from nozzle apertures, and relates to the piezoelectric element.

2. Related Art

Ink jet recording heads are a typical type of liquid ejecting head. For example, an ink jet recording head includes a vibration plate defining a part of a pressure generating chamber communicating with nozzles through which ink droplets are discharged. In the ink jet recording head, a piezoelectric element deforms the vibration plate to apply a pressure to the ink in the pressure generating chamber, thereby discharging ink droplets through the nozzles. Some of the piezoelectric elements used in ink jet recording heads have a structure in which a piezoelectric layer made of a piezoelectric material capable of electromechanical conversion, such as a crystallized dielectric material, is disposed between two electrodes.

The piezoelectric material of the piezoelectric layer of such a piezoelectric element is required to have high piezoelectric properties. In order that the piezoelectric layer exhibits satisfactory piezoelectric properties, it is desirable that the piezoelectric material be oriented parallel to any of the {100} planes in a rhombohedral system. In order to orient lead zirconate titanate (PZT) in a direction parallel to a {100} plane, for example, seed titanium may be used in a piezoelectric layer (for example, JP-A-2011-238774 and JP-A-2005-340428). JP-A-2011-238774 discloses a method for manufacturing a piezoelectric element in which a lead titanate layer is used as a seed layer so that the piezoelectric layer can be oriented in a direction parallel to a {100} plane. Also, JP-A-2005-340428 discloses the technique of orienting the piezoelectric layer in a direction parallel to a {100} plane by using a buffer layer containing an elemental metal that can form the B site of PZT crystals as an orientation control layer.

However, if such an orientation control layer is used, the titanium in the orientation control layer is diffused upward or oxidized, consequently increasing the area of electrical conduction failure in the lower electrode is disadvantageously increased. Also, thermal reaction or the like between the titanium in the orientation control layer and the lead zirconate titanate of the piezoelectric layer reduces the crystallinity of the piezoelectric layer at the vicinity of the lower electrode, thereby degrading piezoelectric properties. Accordingly, an orientation control layer is desired which can suppress the diffusion of titanium and help the piezoelectric layer exhibit satisfactory piezoelectric properties.

This issue can arise not only in an actuator installed in a liquid ejecting head such as an ink jet recording head, but also in actuators in other apparatuses.

SUMMARY

An advantage of some aspects of the invention is that it provides a liquid ejecting head, a liquid ejecting apparatus and a piezoelectric element that each include a piezoelectric layer having increased crystallinity at the vicinity of the lower electrode and exhibiting satisfactory piezoelectric properties and high durability.

According to an aspect of the invention, a piezoelectric element is provided comprising a first electrode, a piezoelectric layer overlying the first electrode with an orientation control layer therebetween, and a second electrode overlying the piezoelectric layer. The piezoelectric layer is made of a complex oxide having a perovskite structure including an A site containing lead and a B site containing zirconium and titanium. The orientation control layer is made of a complex oxide having a perovskite structure including an A site containing lanthanum and a B site containing nickel and titanium.

In this structure, the combination of the piezoelectric layer made of the complex having a perovskite structure containing lead, zirconium and titanium and the orientation control layer made of a complex oxide having a perovskite structure containing lanthanum, nickel and titanium allow the piezoelectric layer to have satisfactory crystallinity at the vicinity of the lower electrode or the first electrode. Consequently, the piezoelectric element can exhibit satisfactory piezoelectric properties and high durability.

In the region of the piezoelectric layer of 20 nm in thickness from the interface between the piezoelectric layer and the orientation control layer, the mole ratio (lead/(zirconium+titanium)) of the lead in the A site to the zirconium and titanium in the B site is preferably in the range of 0.69 to 0.76. Such a liquid ejecting head exhibits an increased withstanding voltage and accordingly has high durability.

In this region of the piezoelectric layer, the mole ratio of the zirconium to the titanium in the B site is preferably in the range of 0.25 to 1.50. Such a piezoelectric layer exhibits large displacement and thus exhibits improved piezoelectric properties.

Preferably, the piezoelectric layer further contains lanthanum in the A site and nickel in the B site. Such a piezoelectric layer exhibits good crystallinity at the vicinity of the first electrode and thus exhibits improved piezoelectric properties.

In the region of the piezoelectric layer of 20 nm in thickness from the interface between the piezoelectric layer and the orientation control layer, the (lead+lanthanum)/(nickel+zirconium+titanium) mole ratio of the lead and lanthanum in the A site to the nickel, zirconium and titanium in the B site is preferably in the range of 0.83 to 0.92. Such a piezoelectric layer exhibits better crystallinity at the vicinity of the first electrode and thus exhibits certainly improved piezoelectric properties.

In the orientation control layer, preferably, the nickel/titanium mole ratio of the nickel to the titanium in the B site is in the range of 0.85 to 1.60 while the lanthanum/(nickel+titanium) mole ratio of the lanthanum in the A site to the nickel and titanium in the B site is 0.91 to 1.04. Such a liquid ejecting head exhibits an increased withstanding voltage and accordingly has high durability.

Preferably, the orientation control layer further contains lead in the A site. By adding lead to the A site of the orientation control layer, lattice mismatch between the crystals of the orientation control layer and the crystals of the piezoelectric layer can be reduced, and thus the epitaxial growth of the piezoelectric layer can be promoted.

In the orientation control layer, the mole ratio ((lead+lanthanum)/(nickel+titanium)) of the lead and lanthanum in the A site to the nickel and titanium in the B site is preferably in the range of 0.90 to 1.14. In this instance, the mole ratio in the orientation control layer of the lead and lanthanum in the A site to the nickel and titanium in the B site is optimal. Accordingly, the lattice mismatch between the crystals of the orientation control layer and the crystals of the piezoelectric layer can be further reduced, and the epitaxial growth of the piezoelectric layer can be further promoted.

Preferably, the first electrode is disposed on a titanium layer. The titanium in the titanium layer diffuses into the orientation control layer, so that the nickel in the B site is substituted with the titanium, which has a larger atomic radius than nickel. Consequently, the lattice mismatch between the crystals of the orientation control layer and the crystals of the piezoelectric layer is still further reduced, and thus the crystallinity of the piezoelectric layer at the vicinity of the first electrode is further increased.

According to another aspect of the invention, a liquid ejecting head including the above-described piezoelectric element is provided. According to another aspect of the invention, a liquid ejecting apparatus including the above-described liquid ejecting head is provided. The liquid ejecting head includes a piezoelectric element comprising a piezoelectric layer having good crystallinity at the vicinity of the lower electrode, and accordingly, the liquid ejecting head and the liquid ejecting apparatus provides high durability.

BRIEF DESCRIPTION OF THE DRAWINGS

The invention will be described with reference to the accompanying drawings, wherein like numbers reference like elements.

FIGS. 9A and 9B are a representation of the structure of the piezoelectric elements of Samples 1 to 17 and Comparative Samples 1 to 3.

DESCRIPTION OF EXEMPLARY EMBODIMENTS

Exemplary Embodiment

Figure 1:
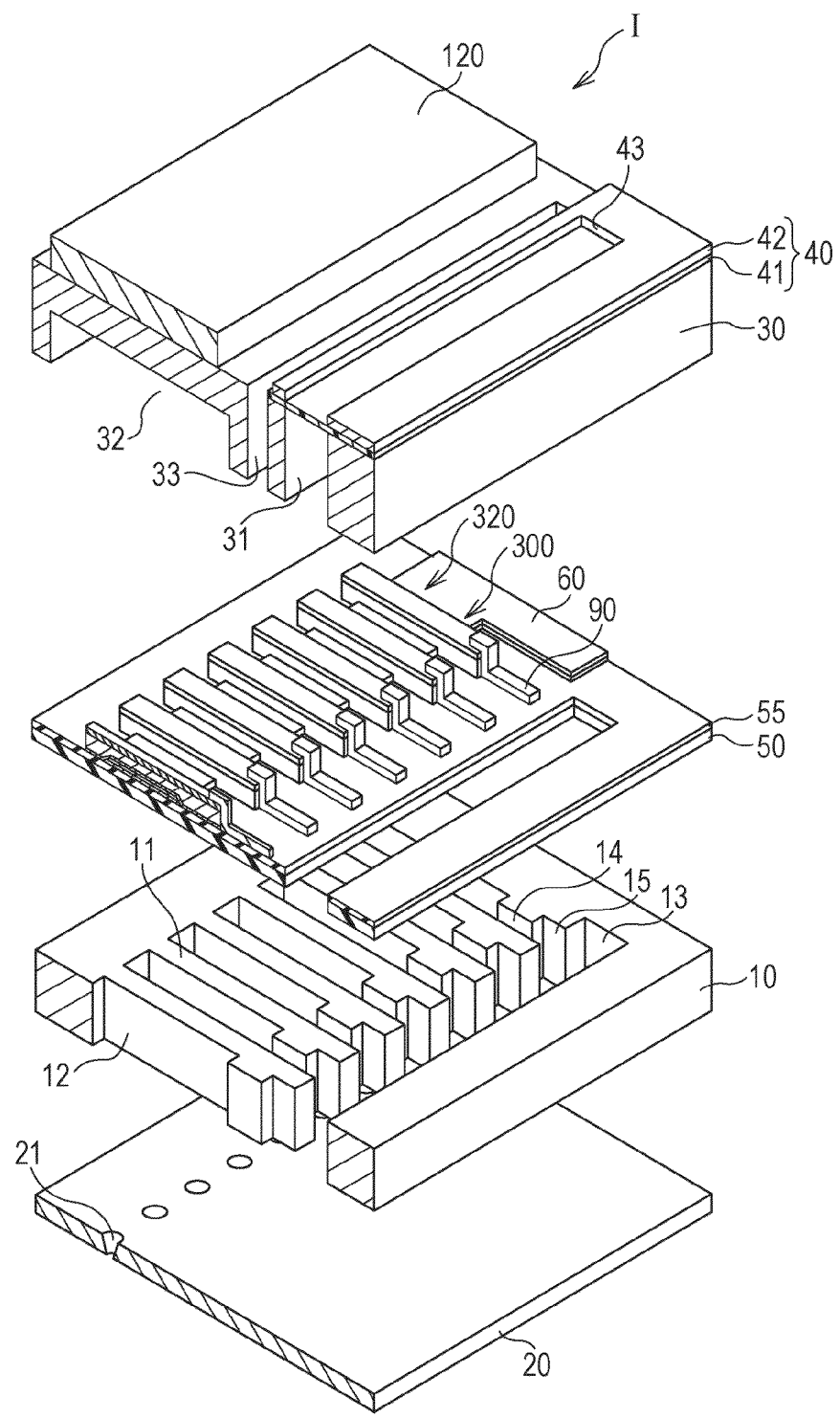
FIG. 1 is a schematic exploded perspective view of a recording head according to an embodiment of the invention.
Figure 2:
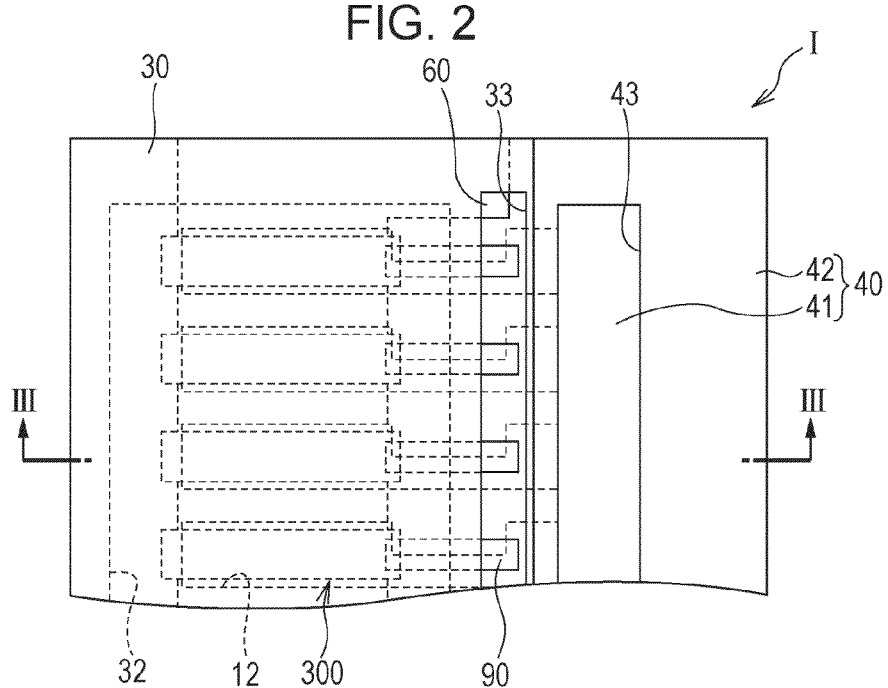
FIG. 2 is a plan view of the recording head according to the embodiment.
Figure 3:
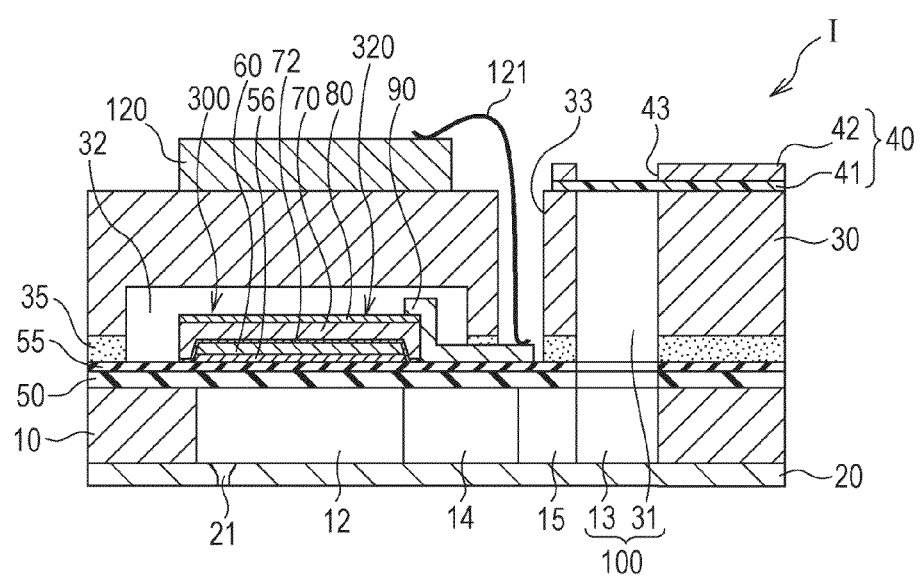
FIG. 3 is a sectional view of the recording head according to the embodiment.

FIG. 1 is a schematic exploded perspective view of an ink jet recording head, which is a type of liquid ejecting head, according to an embodiment of the invention. FIG. 2 is a plan view of the ink jet recording head shown in FIG. 1, and FIG. 3 is a sectional view taken along line III-III shown in FIG. 2. As shown in FIGS. 1 to 3, a flow channel substrate 10 in the present embodiment is defined by a monocrystalline silicon substrate, and a silicon dioxide elastic film 50 is disposed on one surface of the flow channel substrate 10.

The flow channel substrate 10 has a plurality of pressure generating chambers 12 arranged in parallel in the width direction thereof. The flow channel substrate 10 also has a communicating section 13 therein located outside the pressure generating chambers 12 in the longitudinal direction of the pressure generating chambers 12. The communicating section 13 communicates with the pressure generating chambers 12 through corresponding ink supply channels 14 and communication paths 15. The communicating section 13 communicates with a manifold section 31 formed in a below-described protective substrate to define a part of a manifold acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined to a nozzle plate 20 at the open side thereof with an adhesive, a thermal fusion film or the like. The nozzle plate 20 has nozzle apertures 21 communicating with portions around the ends of the corresponding pressure generating chambers 12 opposite to the ink supply channels 14. The nozzle plate 20 can be made of, for example, glass-ceramic, monocrystalline silicon or stainless steel.

On the other hand, the silicon oxide elastic film 50, which has a thickness of, for example, about 0.5 μm to 1.0 μm, is disposed over the other side, opposite to the open side, of the flow channel substrate 10, and an insulating film 55 is formed of, for example, zirconium oxide ($ZrO_2$) on the elastic film 50. The insulating film 55 is provided with an adhesion layer 56 of about 10 nm to 30 nm in thickness on the surface thereof to increase the adhesion between the insulating film 55 and the first electrode 60. The adhesion layer 56 is made of, for example, titanium, zirconium, or an oxide of these metals. Preferably, the adhesion layer 56 is a titanium or zirconium film formed by reactive sputtering.

On the adhesion layer 56, a multilayer structure of piezoelectric elements is disposed which include a first electrode 60 made of, for example, platinum (Pt), an orientation control layer 72 made of a complex oxide having a perovskite structure including an A site containing lanthanum (La) and a B site containing nickel (Ni) and titanium (Ti), described in detail later, a piezoelectric layer 70 including a plurality of piezoelectric material layers 74 made of a complex oxide having a perovskite structure including an A site containing lead (Pb) and a B site containing zirconium (Zr) and titanium (Ti), and a second electrode 80. The piezoelectric elements 300 act as pressure-generating devices that change the pressure in the corresponding pressure-generating chambers 12. The piezoelectric element 300 mentioned herein refers to the portion including the first electrode 60, the piezoelectric layer 70 and the second electrode 80. In general, one of the electrodes acts as a common electrode shared with the piezoelectric elements 300, and the other electrode and the piezoelectric layer 70 are formed for each pressure generating chamber 12 by patterning.

Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of arrangement of the drive circuit and wiring. In the present embodiment, the piezoelectric element 300 and a vibration plate that is displaced by the operation of the piezoelectric element 300 constitute an actuator. In the above-described structure, the elastic film 50 and the insulating film 55 constitute a vibration plate. In another embodiment, however, the vibration plate is not limited to this structure and may be defined by the elastic film 50, the insulating film 55, the adhesion layer 56 and the first electrode 60. The elastic film 50 or the insulating film 55 is not necessarily provided. Alternatively, the piezoelectric element 300 may double as a vibration plate. If the first electrode 60 is disposed directly on the flow channel substrate 10, it is desirable that the first electrode 60 be protected by a protective film to prevent electric continuity between the first electrode and the ink.

The orientation control layer 72 of the present embodiment is made of a complex oxide having a perovskite structure containing lanthanum (La) in the A site and nickel (Ni) and titanium (Ti) in the B site. More specifically, the orientation control layer 72 is made of a complex oxide mainly containing lanthanum nickelate titanate ($La(Ni, Ti)O_3$). A perovskite structure is expressed by $ABO_3$. The A site of the perovskite structure has 12 oxygen ligands, and the B site has 6 oxygen ligands to form an octahedron. The complex oxide of the orientation control layer 72 is basically contain La in the A site and Ni and Ti in the B site.

For forming the orientation control layer 72 in the present embodiment, an orientation control layer precursor film (lanthanum nickelate film) 71 is first formed by a chemical solution process using a specific composition, and then titanium is diffused into the lanthanum nickelate film. The details of this process will be described later. The composition for forming the lanthanum nickelate film is prepared by mixing at least lanthanum acetate, nickel acetate, acetic acid and water, and heating the mixture. In the present embodiment, the titanium to be diffused into the lanthanum nickelate film is the titanium of the B site of the lead zirconate titanate of the piezoelectric layer 70. The titanium of the B site of the piezoelectric layer 70 is diffused into the lanthanum nickelate film by firing the piezoelectric layer 70 and substituted for part of the nickel of the B site of the lanthanum nickelate film. Thus, the lanthanum nickelate film is turned into a lanthanum nickelate titanate film having a perovskite structure containing La in the A site and Ni and Ti in the B site, thereby forming the orientation control layer 72.

Titanium has a larger atomic radius than nickel. The interstitial distance of the lanthanum nickelate titanate of the orientation control layer 72 is therefore increased to some extent from the interstitial distance before the substitution by the titanium substituted for part of the nickel in the B site. On the other hand, the interstitial distance of the lead zirconate titanate of the piezoelectric layer 70 is larger than that of the lanthanum nickelate titanate of the orientation control layer 72. Accordingly, the difference in interstitial distance between the materials of the orientation control layer 72 and the piezoelectric layer 70 can be reduced by the substitution of titanium for nickel in the B site. Thus, the lattice mismatch around the interface between the orientation control layer 72 and the piezoelectric layer 70 is considerably reduced. Thus, the crystallinity of the piezoelectric layer 70 is increased at the vicinity of the first electrode 60, and the epitaxial growth of the piezoelectric layer 70 is promoted. Consequently, the piezoelectric layer 70 exhibits satisfactory piezoelectric properties and high durability.

If the adhesion layer 56 underlying the first electrode 60 is made of titanium, not only the titanium of the piezoelectric layer 70 but also the titanium of the adhesion layer 56 is diffused into the lanthanum nickelate film. Thus a larger amount of titanium is diffused into the lanthanum nickelate film and substituted for the nickel of the B site in the lanthanum nickelate.

Consequently, the lattice mismatch at the interface between the orientation control layer 72 and the piezoelectric layer 70 is further reduced.

Alternatively, the orientation control layer 72 may be formed by forming a lanthanum nickelate titanate film originally containing titanium, instead of by diffusing titanium into a lanthanum nickelate film. For example, the orientation control layer 72 may be formed by a chemical solution process using a specific composition containing metal complexes containing all the constituents: lanthanum, nickel and titanium. The composition for forming the lanthanum nickelate titanate is prepared by mixing at least lanthanum acetate, nickel acetate, titanium acetate, acetic acid and water, and heating the mixture. If a lanthanum nickelate titanate film originally containing titanium is formed, the lattice mismatch at the interface between the orientation control layer 72 and the piezoelectric layer 70 is also considerably reduced, and the crystallinity of the piezoelectric layer 70 is increased at the vicinity of the first electrode 60. The lanthanum nickelate film or the lanthanum nickelate titanate film may be formed by, but not limited to, sputtering or vapor deposition.

Preferably, titanium accounts for a large part of the B site in the orientation control layer 72. More specifically, it is preferable that the Ni/Ti mole ratio, in the orientation control layer 72, of the nickel to the titanium in the B site be in the range of 0.85 to 1.60 while the La/(Ni+Ti) mole ratio of the lanthanum in the A site to the nickel and titanium in the B site is in the range of 0.91 to 1.04. By increasing the percentage of substitution of titanium for nickel in the B site to a higher level than the normal level (about several percent), the lattice mismatch between the orientation control layer 72 and the piezoelectric layer 70 is reduced, and the epitaxial growth of the piezoelectric layer is promoted accordingly.

Preferably, the orientation control layer 72 further contains lead in the A site and the (Pb+La)/(Ni+Ti) mole ratio of the lead and lanthanum in the A site to the nickel and titanium in the B site is in the range of 0.90 to 1.14. This lead of the A site is the lead that has been diffused from the piezoelectric layer 70 and substituted for part of the lanthanum of the A site in the orientation control layer 72 when the piezoelectric layer 70 has been fired. Similarly, the lanthanum of the A site in the orientation control layer 72 is diffused into the piezoelectric layer 70 and substituted for part of the lead of the A site in the piezoelectric layer 70. By positively substituting the elements of the A site and B site between the orientation control layer 72 and the piezoelectric layer 70, the lattice mismatch at the interface between the orientation control layer 72 and the piezoelectric layer 70 is considerably reduced. Consequently, the crystallinity of the piezoelectric layer 70 is increased around the interface, or at the vicinity of the first electrode 60, and thus the piezoelectric properties and durability of the piezoelectric layer 70 are improved. Preferably, the orientation control layer 72 has a thickness of 10 nm to 30 nm.

The orientation control layer 72 allows the crystals thereof to be naturally oriented in a direction parallel to a {100} plane and also strongly orients the crystals having a perovskite structure of the piezoelectric layer 70 on the orientation control layer 72 in the direction parallel to the {100} plane. Such an orientation control layer 72 further improves the piezoelectric properties and durability of the piezoelectric layer 70. A phrase "strongly orients the crystals in a direction parallel to a {100} plane" mentioned herein may imply that all the crystals are oriented in a {100} plane, or that most of the crystals are oriented in the {100} plane.

The physical properties, such as displacement, dielectric constant, and Young's modulus, of the piezoelectric layer 70, or piezoelectric material, vary depending on the crystal orientation of the piezoelectric material. When the orientation of a piezoelectric material is strongly oriented in a direction or oriented substantially in one direction, the piezoelectric material can exhibit piezoelectric properties superior to the case of being oriented in random directions or in some specific directions. In particular, the crystals of the piezoelectric layer 70 strongly oriented in a direction parallel to a {100} plane take an engineered domain arrangement, in which the polarization direction is equivalent to the direction in which a voltage is applied, and thus the piezoelectric layer 70 can exhibit satisfactory piezoelectric properties.

The piezoelectric layer 70 of the present embodiment is made of a complex oxide having a perovskite structure containing lead (Pb) in the A site and zirconium (Zr) and titanium (Ti) in the B site. More specifically, the piezoelectric layer 70 is made of a complex oxide mainly containing lead zirconate titanate (PZT or Pb(Zr, Ti)O$_3$). This perovskite complex oxide basically includes an A site containing Pb and a B site containing Zr and Ti.

In the region of the piezoelectric layer 70 of 20 nm in thickness from the interface between the piezoelectric layer 70 and the orientation control layer 72, the Pb/(Zr+Ti) mole ratio of the lead in the A site to the zirconium and titanium in the B site is preferably in the range of 0.69 to 0.76, and, in addition, the Zr/Ti mole ratio of the zirconium to the titanium in the B site is preferably in the range of 0.25 to 1.50. By controlling the proportions of the metal elements of the piezoelectric layer 70 to these mole ratios, piezoelectric properties and durability are improved, and, for example, piezoelectric displacement and withstand voltage are increased.

Preferably, the piezoelectric layer 70 further contains lanthanum in the A site and nickel in the B site. As described above, the lanthanum of the A site and the nickel of the B site in the piezoelectric layer 70 are brought by diffusion from the orientation control layer 72 when the piezoelectric layer 70 is fired.

The piezoelectric layer 70 is thus made of a complex oxide having a perovskite structure containing lead and lanthanum in the A site and nickel, zirconium and titanium in the B site. In this piezoelectric layer 70, the (Pb+La)/(Ni+Zr+Ti) mole ratio of the lead and lanthanum in the A site to the nickel, zirconium and titanium in the B site is preferably in the range of 0.83 to 0.92. The piezoelectric layer 70 having such a composition exhibits good crystallinity at the vicinity of the first electrode 60 and thus exhibits improved piezoelectric properties and durability.

The piezoelectric layer 70 may be made of lead zirconate titanate (PZT) to which a metal oxide, such as niobium oxide, nickel oxide or magnesium oxide, has been added, instead of lead zirconate titanate. For example, lead magnesate-niobate zirconate-titanate (Pb(Zr, Ti)(Mg, Nb)O$_3$) may be used.

The thickness of the piezoelectric layer 70 is not particularly limited. For example, the thickness of the piezoelectric layer 70 may be 3 μm or less, and is preferably 0.3 μm to 1.5 μm.

Each of the second electrodes 80, which are discrete electrodes of the piezoelectric elements 300, is connected to a lead electrode 90 made of, for example, gold (Au). The lead electrode 90 extends from the end of the second electrode 80 near the ink supply channel 14 to the surface of the elastic film 50 or the insulating film 55.

A protective substrate 30 having a manifold section 31 defining at least part of a manifold 100 is joined to the flow channel substrate 10 having the piezoelectric elements 300 with an adhesive 35 so as to cover the first electrode 60, the elastic film 50, the insulating film 55, and the lead electrodes 90. The manifold section 31 passes through the protective substrate 30 in the thickness direction and extends across the widths of the pressure generating chambers 12. Thus, the manifold section 31 communicates with the communicating section 13 of the flow channel substrate 10 to form the manifold 100 that will act as the common ink chamber of the pressure generating chambers 12. The communicating section 13 of the flow channel substrate 10 may be divided for each pressure generating chamber 12, and only the manifold section 31 may serve as the manifold. Alternatively, the flow channel substrate 10 may have only the pressure generating chambers 12, and the manifold 100 and ink supply channels 14 communicating with the respective pressure generating chambers 12 are formed in a member, such as the elastic film 50 or the insulating film 55, between the flow channel substrate 10 and the protective substrate 30.

A piezoelectric element-protecting section 32 is disposed in the region of the protective substrate 30 opposing the piezoelectric elements 300. The Piezoelectric element-protecting section 32 has a space so that the piezoelectric elements 300 can operate without interference. The space of the piezoelectric element-protecting section 32 is intended to ensure the operation of the piezoelectric elements 300, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the protective substrate 30 in the thickness direction. The ends of the lead electrodes 90 extending from the piezoelectric elements 300 are exposed in the through hole 33.

A drive circuit 120 is secured on the protective substrate 30 and drives the piezoelectric elements 300 arranged in parallel. The drive circuit 120 may be a circuit board, a semiconductor integrated circuit (IC) or the like. The drive circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the manifold section 31. The fixing plate 42 is made of a relatively hard material. The portion of the fixing plate 42 opposing the manifold 100 is completely removed to form an opening 43; hence the manifold 100 is closed at one end only with the flexible sealing film 41.

The ink jet recording head I of the present embodiment draws an ink through an ink inlet connected to an external ink supply unit (not shown). The ink is delivered to fill the spaces from the manifold 100 to the nozzle apertures 21. Then, the ink jet recording head I applies a voltage between the first electrode 60 and each second electrode 80 corresponding to the pressure generating chambers 12, according to the recording signal from the drive circuit 120. Thus, the elastic film 50, the insulating film 55, the adhesion layer 56, the first electrode 60 and the piezoelectric layers 70 are deformed to increase the internal pressure in the pressure generating chambers 12, thereby ejecting the ink through the nozzle apertures 21.

A method for manufacturing the ink jet recording head according to the present embodiment will now be described with reference to FIGS. 4A to 8B. FIGS. 4A to 8B are sectional views taken in the longitudinal direction of the pressure generating chambers. In the process of the embodiment described below for forming the orientation control layer 72 of a complex oxide having a perovskite structure containing La, Ni and Ti, an orientation control layer precursor film 71 of a complex oxide having a perovskite structure containing La and Ni is first formed, and then Ti is diffused into the orientation control layer precursor film 71.

Figure 4A:
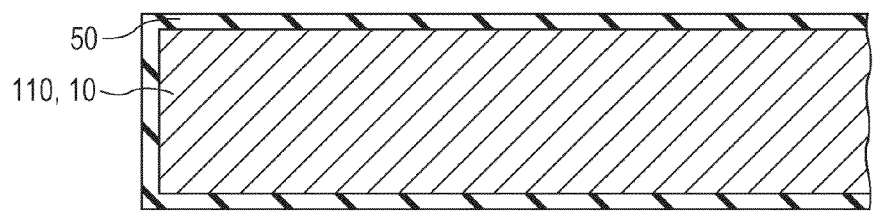
FIGS. 4A and 4B are sectional views of a manufacturing process of the recording head according to the embodiment.
Figure 4B:
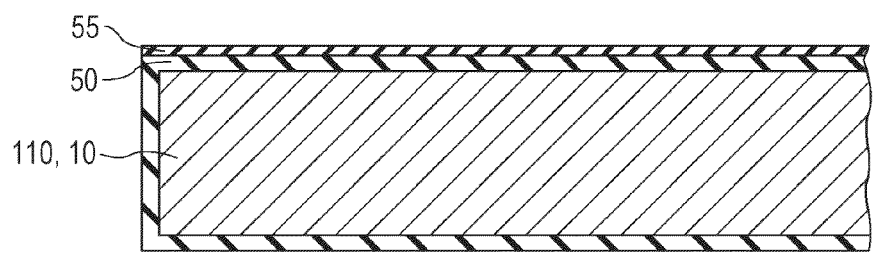

First, as shown in FIG. 4A, a silicon dioxide ($SiO_2$) film is formed for an elastic film 50 on the surface of a flow channel substrate silicon wafer 110. Subsequently, an insulating film 55 is formed of zirconium oxide on the elastic film 50 (silicon oxide film), as shown in FIG. 4B.

Figure 5A:
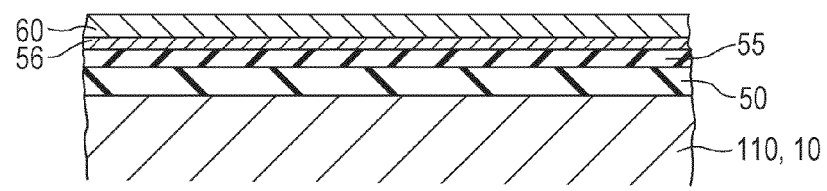
FIGS. 5A and 5B are sectional views of the manufacturing process of the recording head according to the embodiment.
Figure 5B:
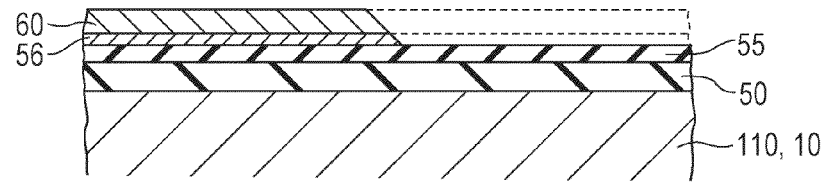

Subsequently, as shown in FIG. 5A, a platinum first electrode 60 is formed on the surface of a titanium adhesion layer 56 by sputtering, vapor deposition, or the like. Then, the first electrode 60 and the adhesion layer 56 are simultaneously patterned so that their sides are inclined as shown in FIG. 5B, using as a mask a resist layer (not shown) having a predetermined shape and disposed on the first electrode 60.

Figure 6A:
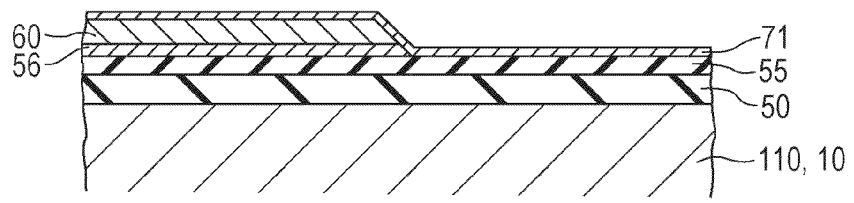
FIGS. 6A to 6D are sectional views of the manufacturing process of the recording head according to the embodiment.

After the resist layer is removed, a lanthanum nickelate orientation control layer precursor film 71 is formed over the first electrode 60, as shown in FIG. 6A. The orientation control layer precursor film 71 is formed by a chemical solution process such as a sol-gel method or metal-organic deposition (MOD), in which a coating of a solution containing a metal complex containing lanthanum and nickel is dried and further fired at a high temperature. The orientation control layer precursor film 71 may be formed by any other process, such as laser ablation, sputtering, pulsed laser deposition (PLD), CVD, or aerosol deposition.

More specifically, in the case where the orientation control layer precursor film 71 is formed by a chemical solution process, first, a composition (precursor solution) for forming the orientation control layer, which may be an MOD solution or a sol containing metal complexes containing La and Ni, is applied onto the Pt first electrode 60 by spin coating or the like (orientation control layer precursor solution coating step), thereby forming an orientation control layer precursor film (lanthanum nickelate film) 71 containing La and Ni.

The precursor solution to be applied for forming the orientation control layer 72 is prepared by dissolving or dispersing in an organic solvent a mixture of metal complexes that can form the orientation control layer precursor film 71. In the present embodiment, the precursor solution for the orientation control layer 72 contains metal complexes containing La and Ni. In the case of forming an orientation control layer precursor film 71 further containing Ti in addition to La and Ni, a precursor solution containing metal complexes further containing Ti is prepared for the orientation control layer 72. Metal complexes containing La, Ni, or Ti include alkoxides, organic acid salts, and β-diketone complexes.

Exemplary metal complexes containing La include lanthanum acetate and lanthanum 2-ethylhexanoate. Exemplary metal complexes containing Ni include nickel acetate, nickel nitrate, and nickel 2-ethylhexanoate. Exemplary metal complexes containing Ti include titanium acetate and titanium 2-ethylhexanoate. Metal complexes containing two or more metals of La, Ni and Ti may be used. Examples of the solvent in the precursor solution of the orientation control layer 72 include propanol, butanol, pentanol, hexanol, octanol, ethylene glycol, propylene glycol, octane, decane, cyclohexane, xylene, toluene, tetrahydrofuran, acetic acid, and octylic acid.

For forming such an orientation control layer precursor film 71, the precursor solution containing metal complexes that can form the orientation control layer precursor film 71 is applied onto the Pt first electrode 60, followed by firing. The composition of the precursor solution of the orientation control layer 72 is not particularly limited, and the materials are mixed so that the proportions of the metal elements come to the above-described mole ratios.

Subsequently, the orientation control layer precursor film 71 is heated to a predetermined temperature (for example, 150 to 450° C.) and is then kept at that temperature for a certain time (for example, 1 to 10 minutes), thus subjected to drying and degreasing at one time (orientation control layer precursor film drying and degreasing step). The degreasing mentioned herein is performed to convert organic components in the orientation control layer precursor film 71 into, for example, $NO_2$, $CO_2$ or $H_2O$ and thus to remove the organic components. The drying and degreasing step may be performed in any atmosphere without particular limitation, and may be performed in the air, an oxygen atmosphere or an inert gas atmosphere.

Figure 6B:
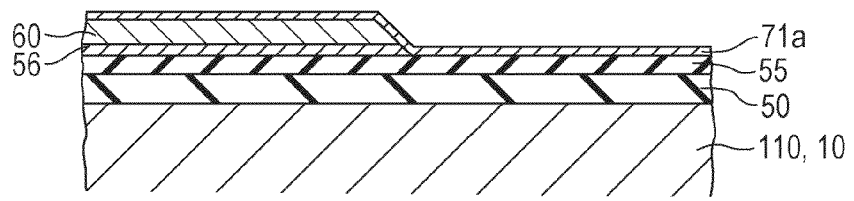

Then, as shown in FIG. 6B, the orientation control layer precursor film 71 is heated to a predetermined temperature, for example, to about 600 to 850° C., and is then kept at that temperature for a certain time such as 1 to 10 minutes, thus being crystallized into a lanthanum nickelate film 71a (firing step).

The firing step may also be performed in any atmosphere without particular limitation, and may be performed in the air, an oxygen atmosphere or an inert gas atmosphere. The heating apparatus used for the drying, degreasing and firing steps of the orientation control layer precursor film 71 may be a rapid thermal annealing (RTA) apparatus using an infrared lamp for heating, or a hot plate.

In the present embodiment, the orientation control layer precursor film 71 is formed in a single layer by a single operation of coating. However, the orientation control layer precursor film 71 may include a plurality of layers.

Subsequently, a piezoelectric layer 70 of a complex oxide containing Pb, Zr and Ti is formed on the crystallized lanthanum nickelate film 71a. The piezoelectric layer 70 may be formed, for example, by applying a solution containing metal complexes containing Pb, Zr and Ti, and drying and degreasing the coating of the solution. The piezoelectric layer 70 may be formed by any other method, such as laser ablation, sputtering, pulsed laser deposition (PLD), CVD, or aerosol deposition.

Figure 6C:
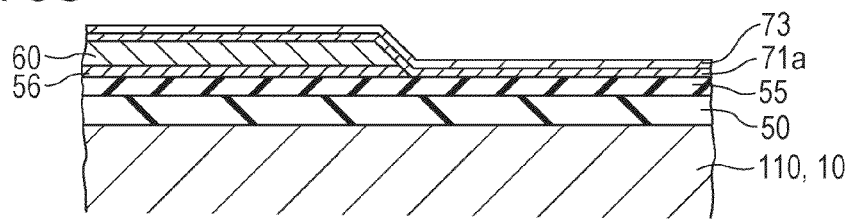

For forming the piezoelectric layer 70 by a chemical solution process, first, an MOD solution or sol (piezoelectric layer precursor solution) of a composition containing metal complexes containing Pb, Zr and Ti is applied onto the crystallized lanthanum nickelate film 71a by spin coating or the like to form a precursor film 73 of the piezoelectric layer 70, as shown in FIG. 6C (coating step).

The precursor solution for forming the piezoelectric layer 70 is prepared by dissolving or dispersing in an organic solvent a mixture of metal complexes that can form a complex oxide containing Pb, Zr and Ti by firing. For forming a piezoelectric layer precursor film 73 further containing Mg and Nb in addition to Pb, Zr and Ti, a precursor solution further containing metal complexes containing Mg and Nb is used. Metal complexes containing Pb, Zr, or Ti include alkoxides, organic acid salts, and β-diketone complexes. These metal complexes are mixed so that the proportions of the metal elements come to desired mole ratios.

The metal complex containing Pb may be a lead acetate. Exemplary metal complexes containing Zr include zirconium acetylacetonate, zirconium tetraacetylacetonate, zirconium monoacetylacetonate, and zirconium bisacetylacetonate. Exemplary metal complexes containing Ti include titanium alkoxides such as titanium isopropoxide. A metal complex containing two or more metals of Pb, Zr, Ti, Mg and Ni may be used.

Examples of the solvent in the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Subsequently, the piezoelectric layer precursor film 73 is dried for a certain time by being heated to a predetermined temperature (for example, 150 to 200° C.) (drying step). Then, the dried piezoelectric layer precursor film 73 is degreased by being heated to a predetermined temperature (for example, 350 to 450° C.) and kept at that temperature for a certain time (degreasing step). The degreasing mentioned herein is performed to convert organic components in the piezoelectric layer precursor film 73 into, for example, $NO_2$, $CO_2$ or $H_2O$ and thus to remove the organic components. The drying and degreasing steps may be performed in any atmosphere without particular limitation, and may be performed in the air, an oxygen atmosphere or an inert gas atmosphere. The steps of coating, drying and degreasing may be repeated.

Then, the resulting piezoelectric layer precursor film 73 is fired by being heated to a predetermined temperature, such as about 600 to 850° C., and kept at that temperature for a certain time, such as 1 to 10 minutes (firing step). Thus, the piezoelectric layer precursor film is crystallized into the piezoelectric material layer 74 of a complex oxide having a perovskite structure containing Pb, Zr and Ti. The firing step may also be performed in any atmosphere without particular limitation, and may be performed in the air, an oxygen atmosphere or an inert gas atmosphere. The heating apparatus used for the drying, degreasing and firing steps may be a rapid thermal annealing (RTA) apparatus using an infrared lamp for heating, or a hot plate.

Figure 6D:
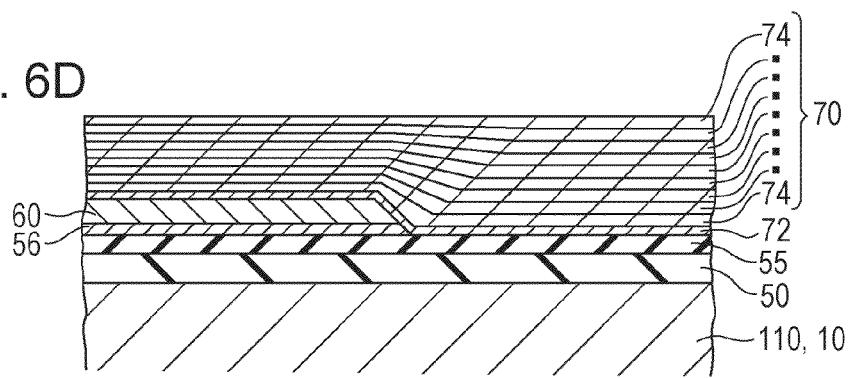

Subsequently, a plurality of piezoelectric material layers 74 are formed by repeating the sequence of performing the coating, drying and degreasing steps, or the sequence of performing the coating, drying, degreasing and firing steps according to the desired thickness. Thus a piezoelectric layer 70 including the piezoelectric material layers 74 is formed as shown in FIG. 6D. If, for example, a coating film formed by a single application of the coating solution has a thickness of about 0.1 μm, the piezoelectric layer 70 including 10 piezoelectric material layers 74 has a thickness of about 1.0 μm. Although the piezoelectric layer 70 has a multilayer structure in the present embodiment, the piezoelectric layer 70 may be defined by a single layer. Alternatively, an orientation control layer 72 and a plurality of piezoelectric material layers 74 define a piezoelectric layer 70.

When the piezoelectric material layers 74 (piezoelectric layer 70) are fired, the titanium in the piezoelectric material layer 74 and the adhesion layer 56 is diffused into the orientation control layer precursor film 71. Consequently, the orientation control layer precursor film 71 is turned into an orientation control layer 72 of lanthanum nickelate titanate containing La, Ni and Ti. In the present embodiment, the amount of diffused titanium is larger than a normal diffusion level (by several percent). Accordingly, a considerably high percentage of the nickel is substituted with titanium in the B site of the orientation control layer 72.

As described above, titanium is diffused into the orientation control layer precursor film 71 and substituted for part of the nickel of the B site in the lanthanum nickelate film. Thus, the difference in interstitial distance between the lanthanum nickelate and the piezoelectric layer 70 is reduced. Consequently, the lattice mismatch around the interface between the orientation control layer 72 and the piezoelectric layer 70 is considerably reduced, and the crystallinity of the piezoelectric layer 70 is increased. Thus, the withstand voltage and the piezoelectric properties, such as strain, of the piezoelectric element including the piezoelectric layer 70 are increased, and the durability of the element is increased, as will be described later in Examples.

Figure 7A:
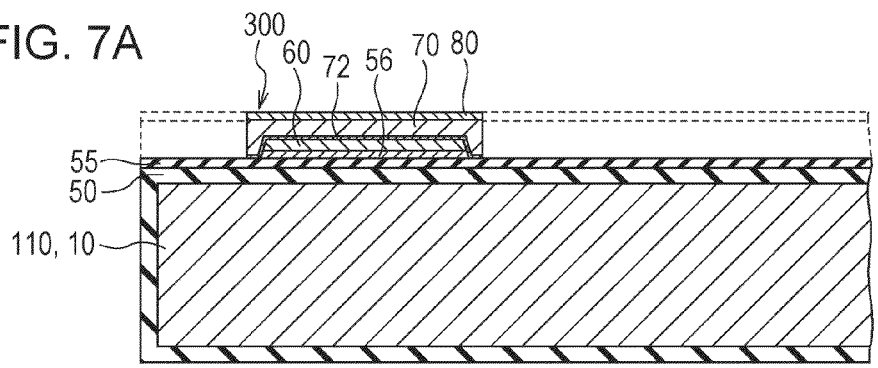
FIGS. 7A to 7C are sectional views of the manufacturing process of the recording head according to the embodiment.

After the piezoelectric layer 70 is formed, a second electrode 80 is formed of indium or the like on the piezoelectric layer 70 by, for example, sputtering, and the piezoelectric layer 70 and the second electrode 80 are simultaneously patterned so as to form piezoelectric elements 300, each including the first electrode 60, the piezoelectric layer 70 and the second electrode 80, in regions corresponding to the pressure generating chambers 12, as shown in FIG. 7A. The patterning of the piezoelectric layer 70 and the second electrode 80 can be performed at one time by dry etching through a resist layer (not shown) having a predetermined shape. Then, annealing may be performed at a temperature of, for example, 600 to 850° C., if necessary. Thus, satisfactory interfaces can be formed between the piezoelectric layer 70 and the first electrode 60 and between the piezoelectric layer 70 and the second electrode 80, and, in addition, the crystallinity of the piezoelectric layer 70 can be further improved.

Figure 7B:
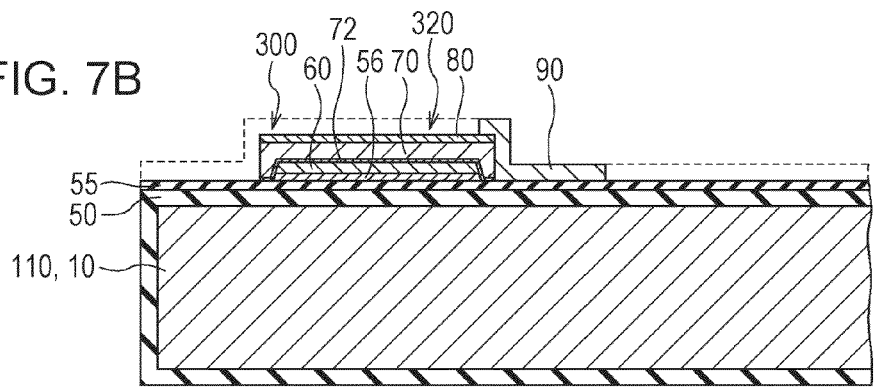

Then, a layer of, for example, gold (Au) is formed over the entire surface of the flow channel substrate wafer 110, and is patterned into lead electrodes 90 for each piezoelectric element 300, as shown in FIG. 7B, through a mask pattern (not shown) made of, for example, resist.

Figure 7C:
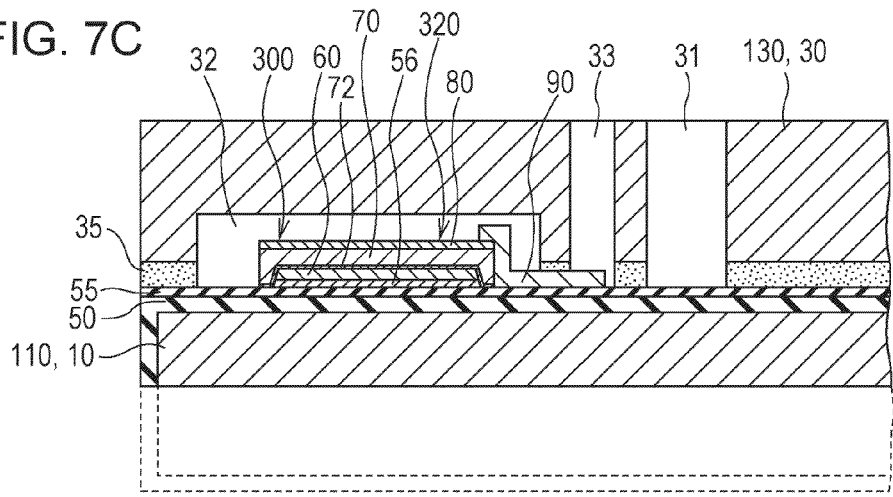

Then, a silicon protective substrate wafer 130 for a plurality of protective substrates 30 is bonded to the surface having the piezoelectric elements 300 of the flow channel substrate wafer 110 with an adhesive 35, and the thickness of the flow channel substrate wafer 110 is reduced to a predetermined level, as shown in FIG. 7C.

Figure 8A:
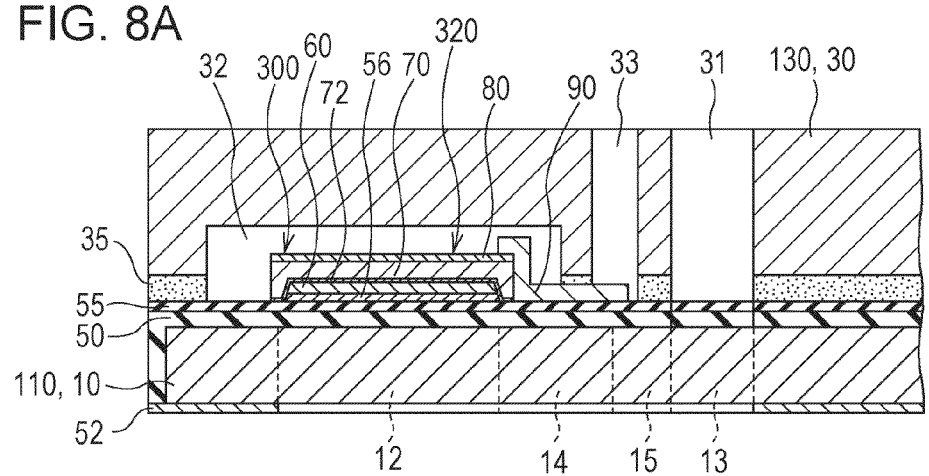
FIGS. 8A and 8B are sectional views of the manufacturing process of the recording head according to the embodiment.
Figure 8B:
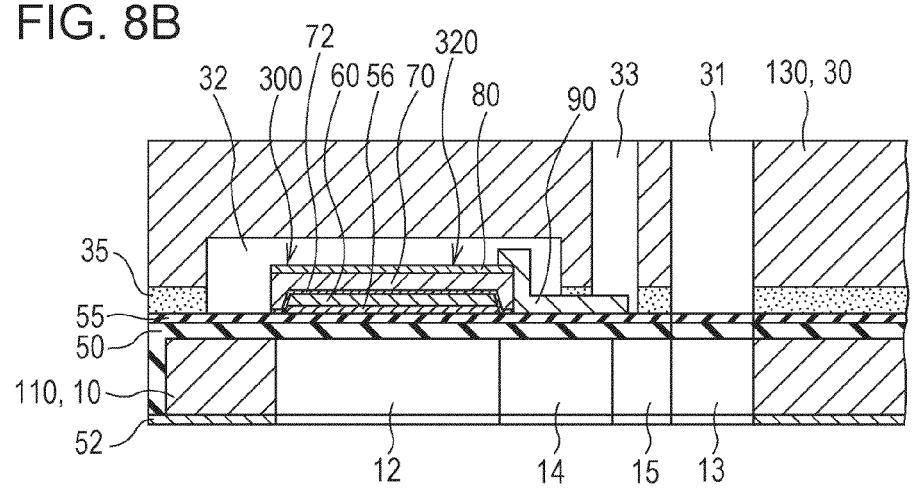

Subsequently, as shown in FIG. 8A, a mask layer is formed on the surface of the flow channel substrate wafer 110 opposite to the protective substrate wafer 130 and is patterned into a mask 52 having a predetermined shape. Then, as shown in FIG. 8B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 has been removed, and a compliance substrate 40 is joined to the protective substrate wafer 130. The flow channel substrate wafer 110 joined to other substrates is cut into chips as shown in FIG. 1, each including a flow channel substrate 10 and other members. Thus, the ink jet recording head I of the present embodiment is completed.

EXAMPLE

The invention will be further described in detail with reference to Examples below. However, the invention is not limited to the following Example. FIGS. 9A and B are a schematic representation of the structures of the piezoelectric elements of Samples 1 to 17 and Comparative Samples 1 to 3.
Samples 1 to 5
Table 1 shows the structures of the piezoelectric elements of Samples 1 to 5 and Comparative Samples 1 to 3.
Preparation of Composition for Forming Lanthanum Nickelate Film For this composition, lanthanum acetate 1.5-hydrate (La$(CH_3COO)_3 \cdot 1.5H_2O$) and nickel acetate tetrahydrate (Ni$(CH_3COO)_2 \cdot 4H_2O$) were used as the main constituents, and propionic acid was used as the solvent. The mixture of these materials was heated to 120° C. on a hot plate to ion-exchange the acetates by the propionic acid and stirred for about one hour, and to adjust the concentration of the lanthanum acetate and the nickel acetate in the mixture to be 0.25 mol/L. The solution was cooled to yield a lanthanum nickelate precursor solution.
Piezoelectric Element First, a silicon dioxide ($SiO_2$) film was formed to a thickness of 1500 nm on a {110} monocrystalline silicon (Si) substrate by thermal oxidation. Subsequently, a zirconium (Zr) film was formed on the surface of the $SiO_2$ film by RF magnetron sputtering, and the Zr film was thermally oxidized to form a 400 nm thick zirconium oxide ($ZrO_2$) film. Thus a vibration plate including the $SiO_2$ layer and the $ZrO_2$ layer was formed. Subsequently, a 20 nm thick titanium adhesion layer 56 was formed on the surface of the $ZrO_2$ film by RF magnetron sputtering, and then a 50 nm thick {111}-oriented platinum film (first electrode 60) was formed on the titanium adhesion layer by RF magnetron sputtering. However, the vibration plate of Sample 2 was a 1.0 μm thick $SiO_2$ film, and the adhesion layer of Sample 5 was a 20 nm thick zirconium film.

Subsequently, a lanthanum nickelate film was formed on the first electrode 60. More specifically, a lanthanum nickelate precursor film (orientation control layer precursor film 71) was formed as shown in FIG. 6A by dropping the above-prepared composition for forming the lanthanum nickelate film (orientation control layer precursor solution) onto the first electrode on the substrate being rotated at 2200 rpm (coating step). Subsequently, the lanthanum nickelate precursor film was dried and degreased at one time by being heated at 270° C. for 5 minutes. Then, the precursor film was fired at 750° C. for 5 minutes in an oxygen atmosphere using a high-speed heat treatment apparatus (RTA/RTP). Thus the precursor film was crystallized into a lanthanum nickelate film 71a.

Subsequently, a piezoelectric layer 70 was formed on the lanthanum nickelate film 71a. More specifically, a composition for forming a piezoelectric layer (piezoelectric layer precursor solution) was prepared which contained lead acetate trihydrate (Pb$(CH_3COO)_2 \cdot 3H_2O$), titanium isopropoxide (Ti[OCH$(CH_3)_2]_4$) and zirconium acetylacetonate (Zr$(CH_3COCHCOCH_3)_4$) as main constituents, butyl cellosolve ($C_6H_{14}O_6$) as the solvent, diethanolamine ($C_4H_{11}NO_2$) as a stabilizer, and polyethylene glycol ($C_2H_6O_6$) as a thickener.

The proportion of the constituents in the piezoelectric layer precursor solution was lead acetate trihydrate:titanium isopropoxide:zirconium acetylacetonate:butyl cellosolve:diethanolamine:polyethylene glycol=1.18:0.48:0.52:3:0.65:0.5, on a mole basis. Lead acetate trihydrate was added in 18% higher proportion in view of evaporation. For the preparation of the precursor solution, butyl cellosolve and titanium isopropoxide were first mixed, and diethanolamine and lead acetate, and then zirconium acetylacetonate were added to the mixture. The resulting mixture was heated and stirred at 90° C. for 90 minutes on a hot plate. Finally, polyethylene glycol was added, and the mixture was stirred at room temperature to yield a lead zirconate titanate precursor solution.

Subsequently, a piezoelectric layer precursor film was formed by dropping the above-prepared piezoelectric layer 70 precursor solution onto the lanthanum nickelate film 71a for 30 seconds while the substrate was rotated at 1200 rpm (coating step). After being heated at 180° C. for 3 minutes (drying step) and then at 360° C. for 3 minutes (degreasing step) on a hot plate, the piezoelectric layer precursor film 73 was crystallized by being fired at 750° C. for 5 minutes in an oxygen atmosphere using a high-speed heat treatment apparatus (RTA/RTP) (firing step). Thus, a 1000 nm thick piezoelectric layer 70 was formed which is made of lead zirconate titanate (PZT) having a perovskite structure containing lead (Pb), zirconium (Zr) and titanium (Ti). In the drying and degreasing of the piezoelectric layer precursor film 73, the titanium in the piezoelectric layer 70 and the titanium adhesion layer overlying the $ZrO_2$ film was diffused into the lanthanum nickelate film. Thus, a 26 nm thick orientation control layer 72 was completed which contained lanthanum (La), nickel (Ni) and titanium (Ti).

Then, a 40 nm thick iridium film (second electrode 80) was formed on the piezoelectric layer 70 by sputtering, and thus a piezoelectric element 300 of Sample 1 was completed. For each of the piezoelectric elements 300 of Samples 2 to 5, the thickness of the piezoelectric layer was varied from that of Sample 1.
Comparative Samples 1 to 3

A first electrode including a 50 nm thick platinum layer and a 5 nm thick iridium layer was formed on the titanium adhesion layer by RF magnetron sputtering, and an orientation control layer was formed of titanium on the first electrode. The other components or members of Comparative Example 1 were formed in the same manner as those of Sample 1. For the piezoelectric elements of Comparative Samples 2 and 3, the thickness of the piezoelectric layer was varied from that of Comparative Sample 1.

TABLE 1

| | Vibration plate | Adhesion layer | First electrode | Orientation control layer | | Piezoelectric layer (PZT) |
|---|---|---|---|---|---|---|
| | | | | Composition | Thickness (nm) | Thickness (nm) |
| Sample 1 | ZrO$_2$/SiO$_2$ | Ti | Pt | La(Ni,Ti)O$_3$ | 26 | 765 |
| Sample 2 | SiO$_2$ | Ti | Pt | La(Ni,Ti)O$_3$ | 26 | 145 |
| Sample 3 | ZrO$_2$/SiO$_2$ | Ti | Pt | La(Ni,Ti)O$_3$ | 26 | 1000 |
| Sample 4 | ZrO$_2$/SiO$_2$ | Ti | Pt | La(Ni,Ti)O$_3$ | 26 | 130 |
| Sample 5 | ZrO$_2$/SiO$_2$ | Zr | Pt | La(Ni,Ti)O$_3$ | 26 | 145 |
| Comparative Sample 1 | ZrO$_2$/SiO$_2$ | Ti | Ir/Pt | Ti | 4.5 | 765 |
| Comparative Sample 2 | ZrO$_2$/SiO$_2$ | Ti | Ir/Pt | Ti | 4.5 | 117 |
| Comparative Sample 3 | ZrO$_2$/SiO$_2$ | Ti | Ir/Pt | Ti | 4.5 | 1000 |

Samples 6 to 14

Table 2 shows the structures of the piezoelectric elements of Samples 6 to 14. A 20 nm thick titanium adhesion layer 56 was formed on the surface of a 1.0 μm thick SiO$_2$ vibration plate by RF magnetron sputtering, and then a 50 nm thick {111}-oriented platinum film (first electrode 60) was formed on the titanium adhesion layer by RF magnetron sputtering. Then, a piezoelectric layer 70 containing Pb, Zr and Ti was formed on a lanthanum nickelate film 71a formed in the same manner as that of Sample 1, and thus a piezoelectric element 300 was completed. In the piezoelectric layers 70 of Samples 6 to 14, the Pb/(Zr+Ti) mole ratio of the Pb in the A site to the Zr and Ti in the B site was fixed to 1.10, and the Zr/Ti mole ratio of the Zr to the Ti in the B site was varied. More specifically, the Zr/Ti mole ratio was varied by varying the proportion of the main constituents of the piezoelectric layer precursor solution.

TABLE 2

| | Vibration plate | Adhesion layer | First electrode | Piezoelectric layer (PZT) | |
|---|---|---|---|---|---|
| | | | | B site Zr/Ti ratio | Thickness (nm) |
| Sample 6 | SiO$_2$ | Ti | Pt | 0.00 | 1000 |
| Sample 7 | SiO$_2$ | Ti | Pt | 0.11 | 1000 |
| Sample 8 | SiO$_2$ | Ti | Pt | 0.25 | 1000 |
| Sample 9 | SiO$_2$ | Ti | Pt | 0.43 | 1000 |
| Sample 10 | SiO$_2$ | Ti | Pt | 0.67 | 1000 |
| Sample 11 | SiO$_2$ | Ti | Pt | 1.00 | 1000 |
| Sample 12 | SiO$_2$ | Ti | Pt | 1.50 | 1000 |
| Sample 13 | SiO$_2$ | Ti | Pt | 2.33 | 1000 |
| Sample 14 | SiO$_2$ | Ti | Pt | 4.00 | 1000 |

Samples 2 and 15 to 17

Table 3 shows the structures of the piezoelectric elements of Samples 2 and 15 to 17. The piezoelectric elements 300 of Samples 2 and 15 to 17 were varied in the Pb/(Zr+Ti) mole ratio of the Pb in the A site to the Zr and Ti in the B site of the piezoelectric layer 70, the thickness of the piezoelectric layer, the thickness of the orientation control layer, and the compositions of the adhesion layer and the vibration layer.

The vibration plates of Samples 2 and 16 were made of a 1.0 μm thick SiO$_2$ film, and the adhesion layers of Samples 15 and 17 were made of a 20 nm thick zirconium film. The thickness of the orientation layers of Samples 15 and 16 and the thickness of the piezoelectric layers of Samples 2 and 15 to 17 were varied from those of Sample 1. The other components or members of these piezoelectric elements 300 were formed in the same manner as those of Sample 1.

TABLE 3

| | Vibration plate | Adhesion layer | First electrode | Orientation control layer | | Piezoelectric layer (PZT) | |
|---|---|---|---|---|---|---|---|
| | | | | Composition | Thickness (nm) | Pb/(Zr + Ti) ratio of original A/B site | Thickness (nm) |
| Sample 2 | SiO$_2$ | Ti | Pt | La(Ni,Ti)O$_3$ | 26 | 1.18 | 145 |
| Sample 15 | ZrO$_2$/SiO$_2$ | Zr | Pt | La(Ni,Ti)O$_3$ | 21 | 1.18 | 990 |
| Sample 16 | SiO$_2$ | Ti | Pt | La(Ni,Ti)O$_3$ | 16 | 1.18 | 1024 |
| Sample 17 | ZrO$_2$/SiO$_2$ | Zr | Pt | La(Ni,Ti)O$_3$ | 26 | 1.12 | 130 |

Examination 1

Figure 10A:
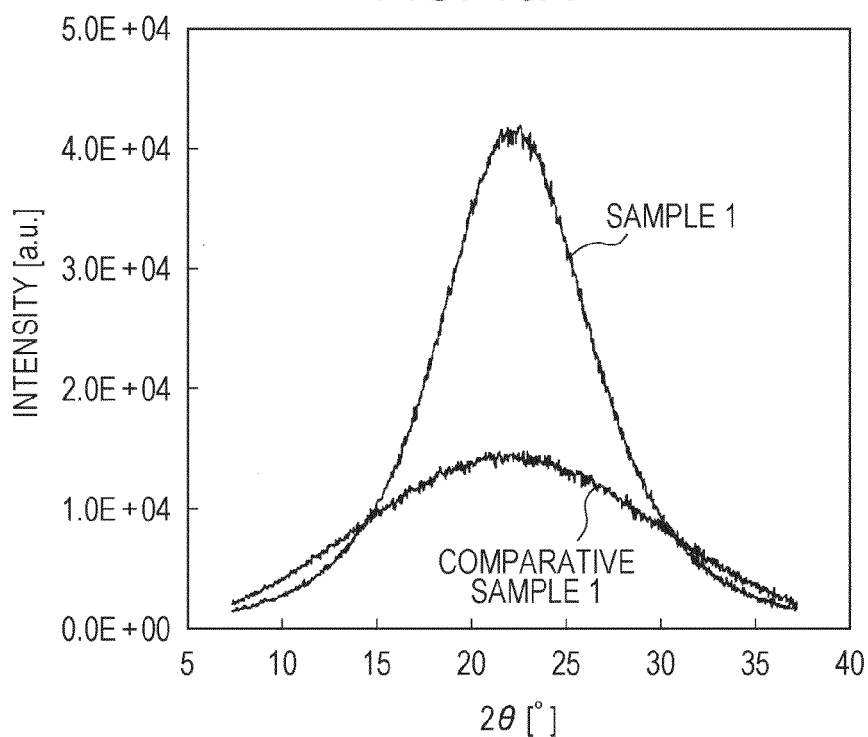
FIGS. 10A and 10B are X-ray diffraction rocking curves and butterfly curves.
Figure 10B:
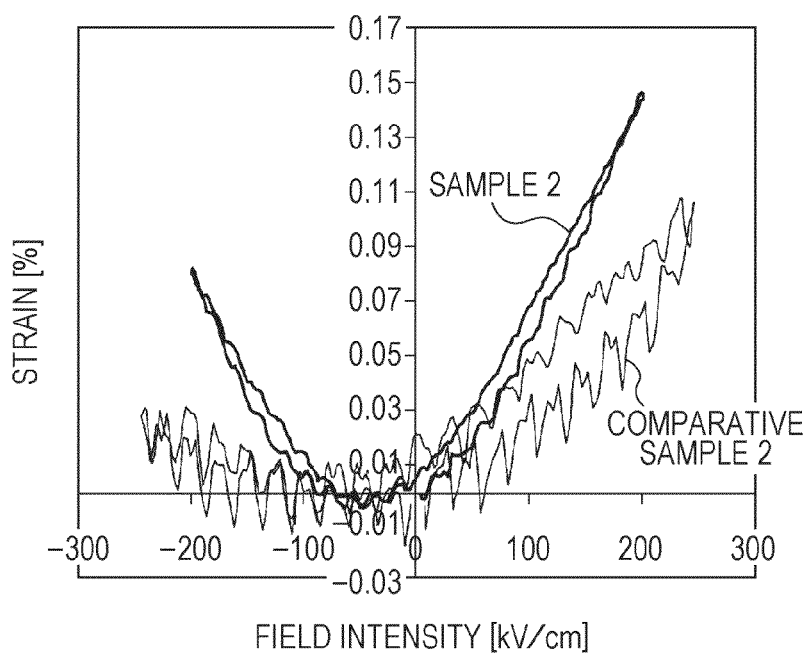

X-ray diffraction rocking curves of a {200} plane were measured using the piezoelectric elements of Sample 1 and Comparative Sample 1. X-ray diffraction was performed using X'Pert Pro MPD manufactured by Spectris. FIG. 10A shows X-ray diffraction rocking curves. Also, butterfly curves showing the relationship between strain (d$_{33}$) and electric field were obtained from measurement using Sample 2 and Comparative Sample 2. The measurement for the butterfly curves was performed using a double-beam laser interferometer (DBLI) manufactured by AIXACT. The obtained butterfly curves are shown in FIG. 10B.

As shown in FIG. 10A, the half-width of the diffraction peak intensity of the PZT {200} plane of Sample 1 was 9.4°, considerably reduced in comparison with that of Comparative Sample 1 of 18.2°. This suggests that the piezoelectric element of Sample 1 was strongly oriented in a direction parallel to a {100} plane, with small fluctuation in orientation. Also, FIG. 10B shows that the piezoelectric element of Sample 2 exhibited larger strain than the piezoelectric element of Comparative Sample 2 and had superior piezoelectric properties.

Examination 2

Figure 11:
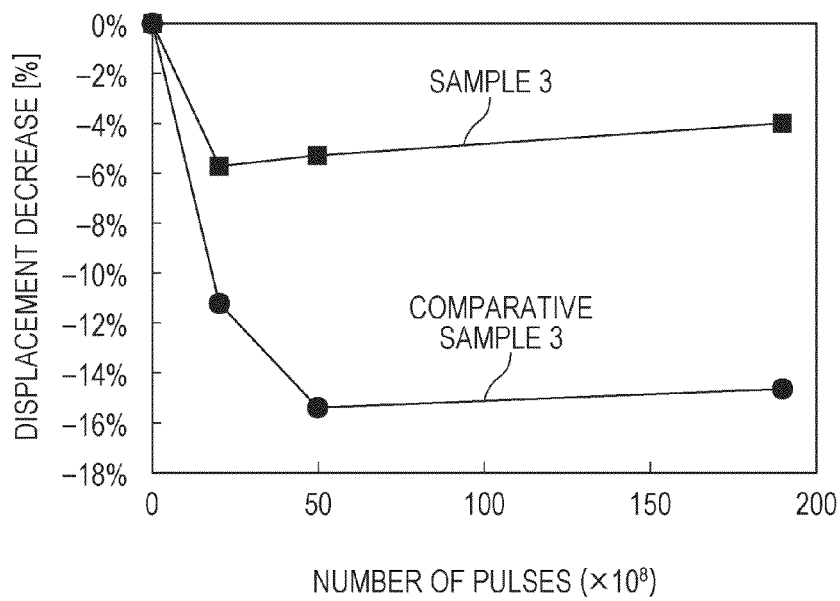
FIG. 11 is a plot showing the relationship between decrease in displacement and the number of pulses.

Decrease in piezoelectric displacement was measured using the piezoelectric elements of Sample 3 and Comparative Sample 3. This measurement was performed using a double-beam laser interferometer (DBLI) manufactured by AIXACT. FIG. 11 shows the relationship between decrease in piezoelectric displacement and the number of pulses.

As shown in FIG. 11, the piezoelectric displacement of Sample 3 was reduced by as little as 4% by applying 19 billion pulses, while the decrease in piezoelectric displacement of Comparative Sample 3 was 15%. Thus, the piezoelectric element of Sample 3 exhibited a higher durability than that of Comparative Example 3.

Examination 3

Figure 12:
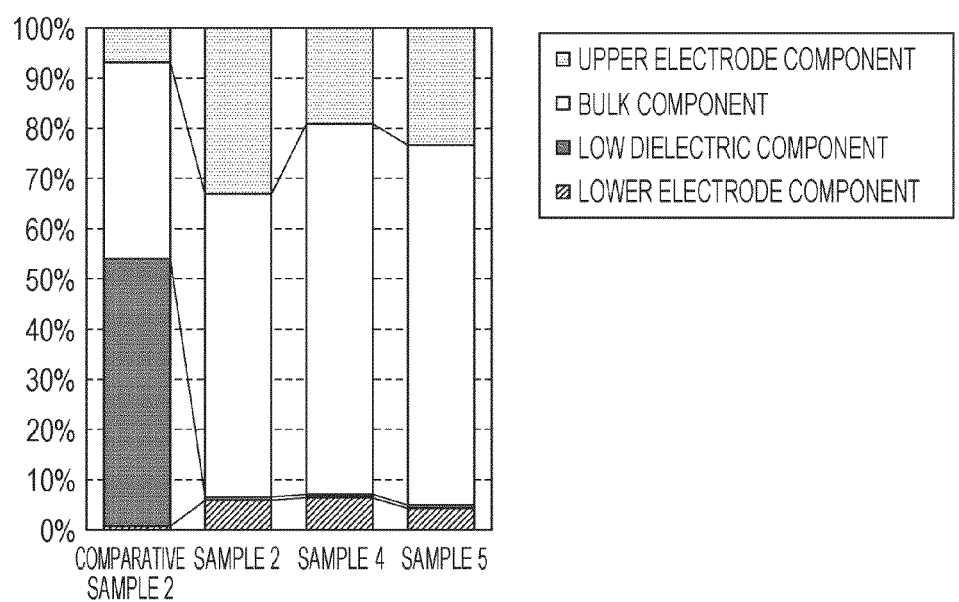
FIG. 12 is a representation of the components of the relative dielectric constant of PZT thin films in the thickness direction.

The impedances of Samples 2, 4 and 5 and Comparative Sample 2 were measured with an impedance analyzer 1260/1296 manufacture by Solartron. The impedance measurement was performed at 300° C. with varying frequency. The reason of this is as below. Since current hardly flows in PZT because of its high resistance, the circuit at an experimentally possible frequency is in a state similar to a circuit whose impedance includes only capacitance. Therefore the cole-cole plot of the circuit did not form a semicircular shape nor reflect an equivalent circuit. Accordingly, temperature load was applied to induce thermal excitation and thus to reduce the resistance of PZT so that cole-cole plots could be compared. FIG. 12 shows the components of the relative dielectric constant of PZTs, calculated from an equivalent circuit model.

As shown in FIG. 12, the PZT of Comparative Sample 2 was divided into four components: upper electrode component; lower electrode component; bulk component (larger than 1100); and low dielectric phase component (less than 600), from the magnitude of relative dielectric constant of the PZT. Comparative Sample 2 showed that the low dielectric phase component accompanied by partial pressure loss accounted for 53.3% of the thickness. On the other hand, the results of Samples 2, 4 and 5 show that the low dielectric phase component was considerably reduced and suggest that a three-layer model can apply to the PZT. Thus, it was found that the piezoelectric elements having orientation control layers of Samples 2, 4 and 5 have satisfactory piezoelectric properties. This is because these orientation control layers 72 were made of lanthanum nickelate titanate that can increase the crystallinity of the piezoelectric layer 70 at the vicinity of the first electrode.

Figure 13:
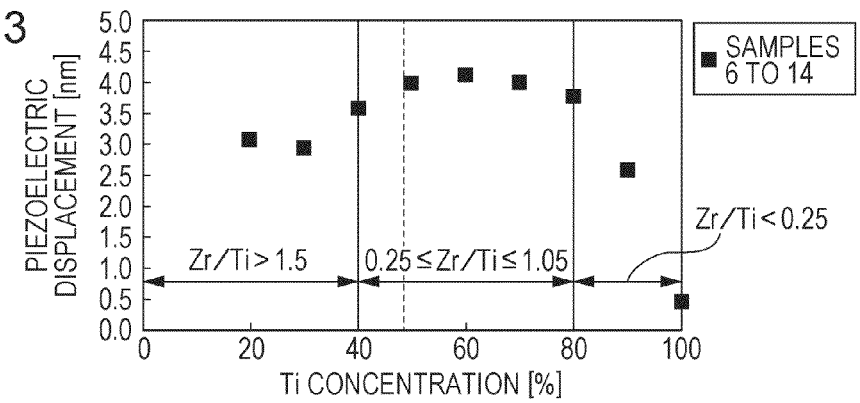
FIG. 13 is a plot showing the relationship between piezoelectric displacement (in terms of $d_{33}$) and titanium concentration.

The piezoelectric displacement of Samples 6 to 14 was measured. The piezoelectric layers 70 of these samples had different Zr/Ti mole ratios in the B site. FIG. 13 shows the relationship between piezoelectric displacement and titanium concentration. Piezoelectric displacement was measured with a double-beam laser interferometer (DBLI) manufactured by AIXACT. When the Zr/Ti mole ratio was in the range of 0.25 to 1.5, the piezoelectric layer 70 exhibited a maximum displacement. It was thus found that a piezoelectric layer with such a composition can exhibit excellent piezoelectric properties.

Examination 4

Figure 14:
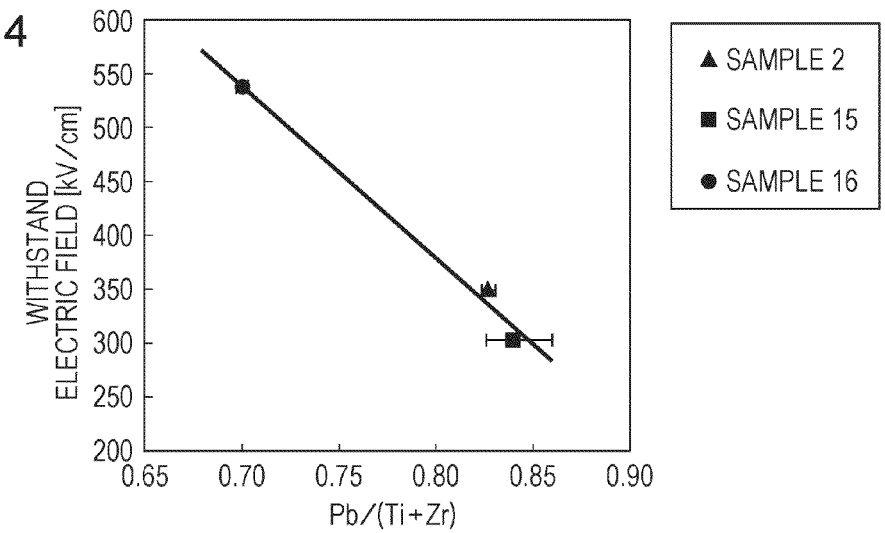
FIG. 14 is a plot showing the relationship between the withstand electric field and the Pb/(Ti+Zr) mole ratio of the piezoelectric layer.

The withstand voltage of Samples 2, 15 and 16 was measured. The piezoelectric layers 70 of these samples had different Pb/(Ti+Zr) mole ratios (mole ratios of the Pb in the A site to the Zr and Ti in the B site). Withstanding voltage was measured with a voltmeter 2400 manufactured by KEITHLEY. FIG. 14 shows the relationship between withstand electric field and Pb/(Ti+Zr) mole ratio.

As shown in FIG. 14, the withstand electric field of Samples 2, 15 and 16 increased as the ratio of Pb in the A site was reduced. In FIG. 14, when the withstand electric field is 450 kV/cm, the Pb/(Ti+Zr) mole ratio lies within the range of 0.69 to 0.76. This suggests that the piezoelectric elements of these samples can exhibit satisfactory piezoelectric properties with increased withstand electric field.

Figure 15:
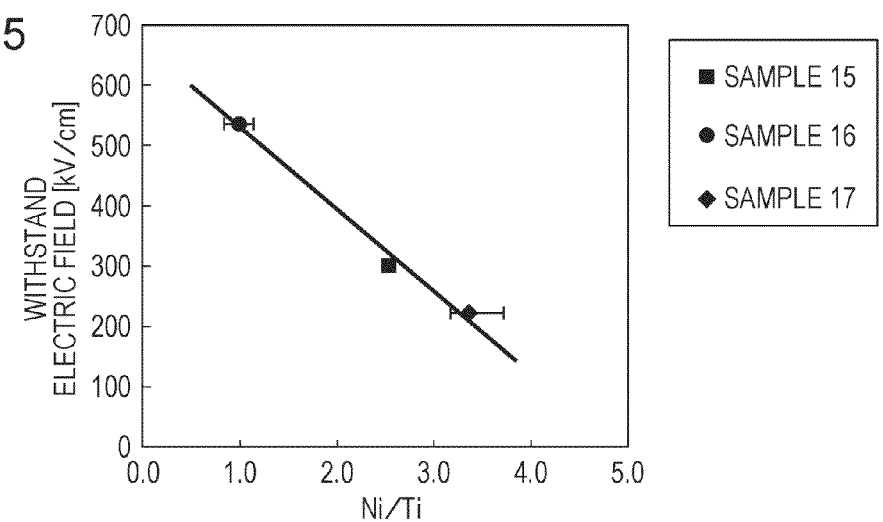
FIG. 15 is a plot showing the relationship between the withstand electric field of the piezoelectric layer and the Ni/Ti mole ratio of the orientation control layer.

The withstanding voltage of Samples 15 to 17 was measured. The orientation control layers 72 of these samples had different Ni/Ti ratios in the B site. FIG. 15 shows the relationship between withstand electric field and Ni/Ti mole ratio (mole ratio of Ni to Ti in the B site). As shown in FIG. 15, the withstand electric field of Samples 15 to 17 increased as the ratio of Ti in the B site was increased. When the withstand electric field is 450 kV/cm or more, the Ni/Ti mole ratio in the B site lies within the range of 0.85 to 1.60. This suggests that the piezoelectric elements of these samples can exhibit satisfactory piezoelectric properties with further increased withstand electric field.

Examination 5

The leakage currents with time of Samples 15 to 17 were measured at a constant voltage (I-t measurement). A DC electric field of 77 kV/cm was applied to the samples, and leakage current was measured at 100 s, at which dielectric relaxation current was reduced. The measurement was performed with an ammeter 6517A manufactured by KEITHLEY.

Figure 16:
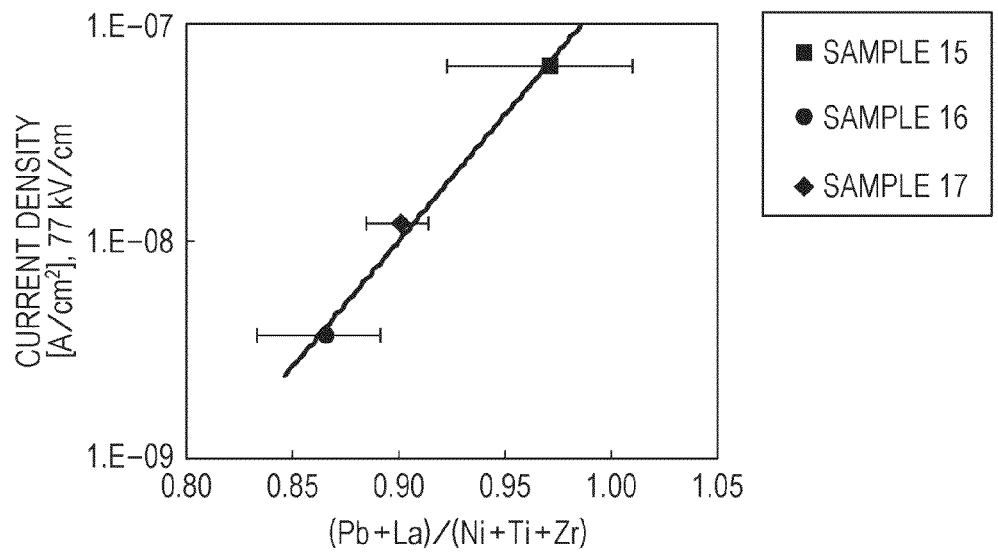
FIG. 16 is a plot showing the relationship between the current density and the (Pb+La)/(Ni+Ti+Zr) mole ratio of the piezoelectric layer.

First, the leakage current of Samples 15 to 17 was measured. The piezoelectric layers 70 of these samples had different (Pb+La)/(Ni+Zr+Ti) mole ratios (mole ratios of the Pb and La in the A site to the Ni, Zr and Ti in the B site). FIG. 16 shows the relationship between current density and (Pb+La)/(Ni+Zr+Ti) mole ratio. As shown in FIG. 16, the current density of Samples 15 to 17 decreased as the (Pb+La) ratio of the A site was reduced. When the current density is $1.20 \times 10^{-8}$ A/cm$^2$ or less, the (Pb+La)/(Ni+Zr+Ti) mole ratio lies within the range of 0.83 to 0.92. This suggests that such piezoelectric elements can exhibit satisfactory piezoelectric properties with reduced current density.

Figure 17:
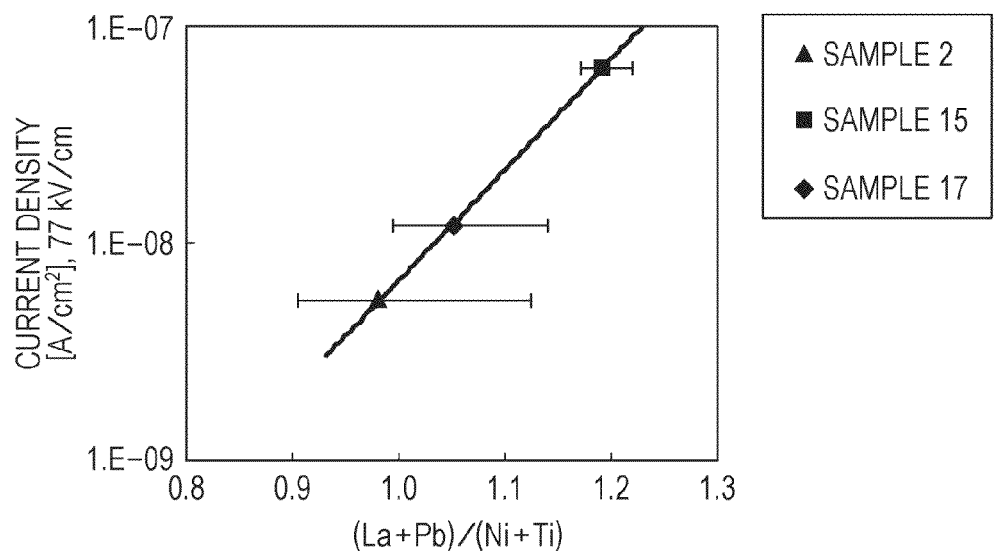
FIG. 17 is a plot showing the relationship between the current density of the piezoelectric layer and the (Pb+La)/(Ni+Ti) mole ratio of the orientation control layer.

Next, Samples 2, 15 and 17, whose orientation control layers 72 have different (Pb+La)/(Ni+Ti) mole ratios (mole ratios of the Pb and La in the A site to the Ni and Ti in the B site), were subjected to I-t measurement. A DC electric field of 77 kV/cm was applied to the samples, and the leakage current was measured at 100 s, at which dielectric relaxation current was reduced. FIG. 17 shows the relationship between current density and the (Pb+La)/(Ni+Ti) mole ratio of the orientation control layer.

As shown in FIG. 17, the current density of Samples 2, 15 and 17 decreased as the (Pb+La) ratio of the A site was reduced. When the current density is $1.20 \times 10^{-8}$ A/cm$^2$ or less, the (Pb+La)/(Ni+Ti) mole ratio lies within the range of 0.90 to 1.14. This suggests that such piezoelectric elements can exhibit satisfactory piezoelectric properties with reduced current density.

Examination 6

Figure 18:
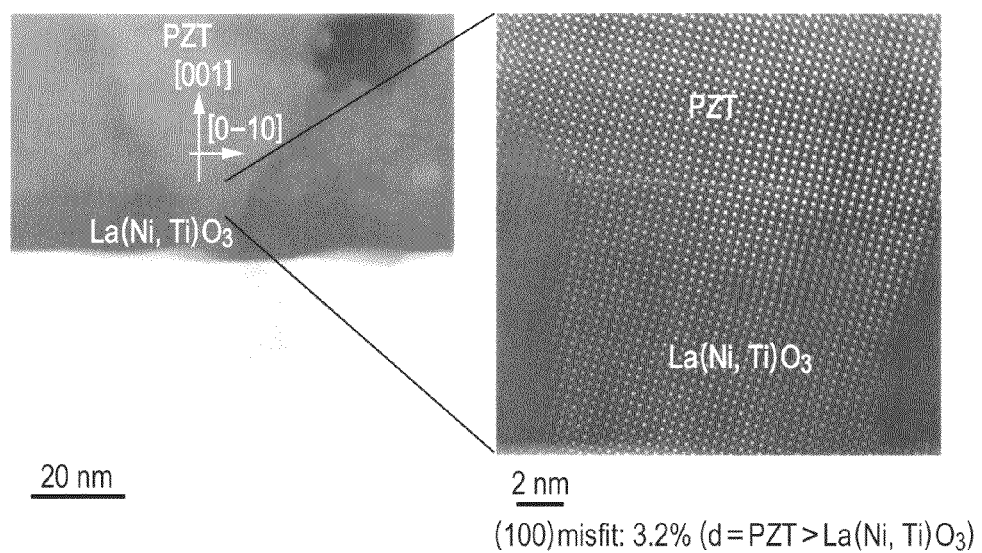
FIG. 18 is a cross-sectional STEM-HAADF image across the interface between a piezoelectric layer and an orientation control layer.

Atomic-level crystal growth at the interface between the piezoelectric layer 70 and the orientation control layer 72 of Sample 16 was observed in the [100] direction. FIG. 18 shows STEM-HAADF images of a cross section across the interface between the piezoelectric layer and the orientation control layer of Sample 16. This observation was performed through an atomic resolution analytical electron microscope ARM200F (accelerating voltage: 200 kV) manufactured by JEOL.

FIG. 18 shows that the PZT of the piezoelectric layer 70 follows the crystal orientation of the lanthanum nickelate titanate (La(Ni, Ti)O$_3$) of the orientation control layer 72, and thus grew epitaxially in a favorable state. The lattice constant of PZT was slightly larger, and its lattice mismatch with La(Ni, Ti)O$_3$ in a direction perpendicular to the in-plane direction was 3.2% at the (0-10) plane. It has been known that the lattice mismatch between PZT and lanthanum nickelate (LaNiO$_3$) not containing titanium is 5.1% at a {100} plane. Thus, the lattice mismatch at the interface between the piezoelectric layer 70 and the orientation control layer 72 of Sample 16 was very low.

Figure 19:
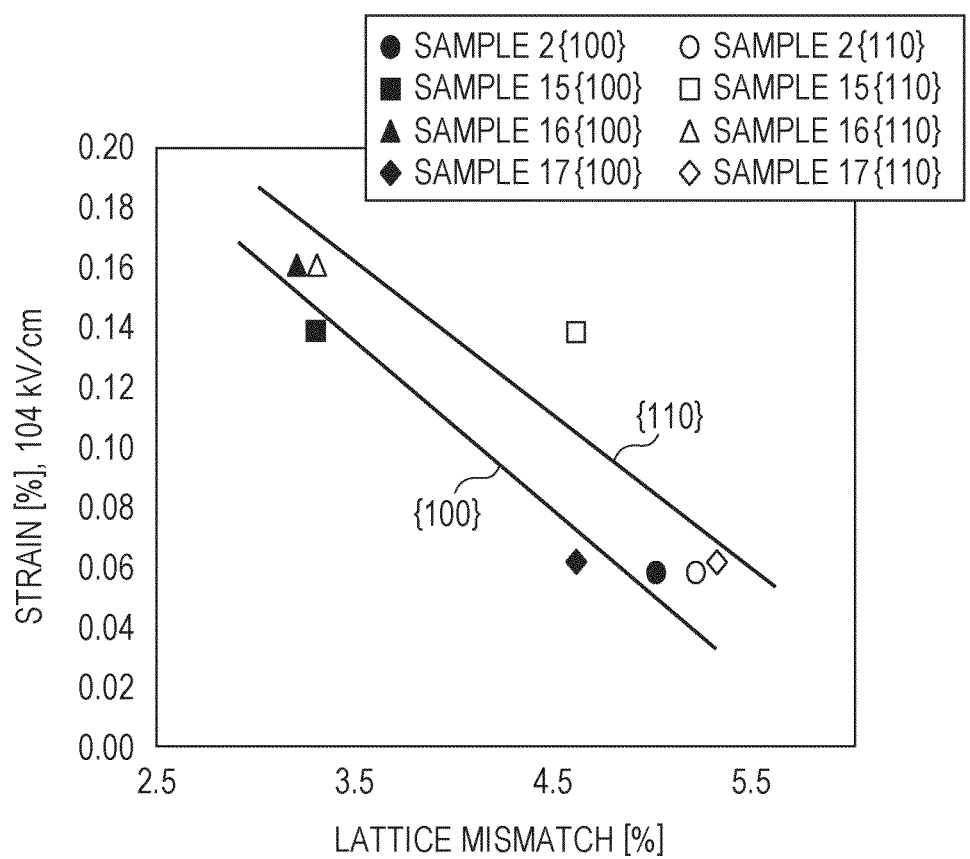
FIG. 19 is a plot showing the relationship between the strain and the lattice mismatch at the interface between the piezoelectric layer and the orientation control layer.

FIG. 19 shows the relationship between the strain and the lattice mismatch of the piezoelectric elements of Samples 2 and 15 to 17. In this instance, the strains are values when an electric field of 104 kV/cm was applied to the piezoelectric elements.

FIG. 19 shows that Samples 2 and 15 to 17 exhibited increased strain and accordingly improved piezoelectric properties as the lattice mismatch of the lanthanum nickelate with PZT at the {100} and {110} planes perpendicular to the in-plane direction was reduced. Furthermore, as the thickness of the PZT layer is increased, the lattice mismatch decreased and the strain increased.

These results suggest that substitution of Ti (147 pm) having a larger atomic radius than Ni (124 pm) for the B site element of LaNiO$_3$ can reduce the lattice mismatch with PZT and helps favorable epitaxial growth. Thus, the crystalline quality of PZT is improved at the vicinity of the interface between the piezoelectric layer 70 and the orientation control layer 72, and the piezoelectric properties are improved.

Examination 7

Figure 20A:
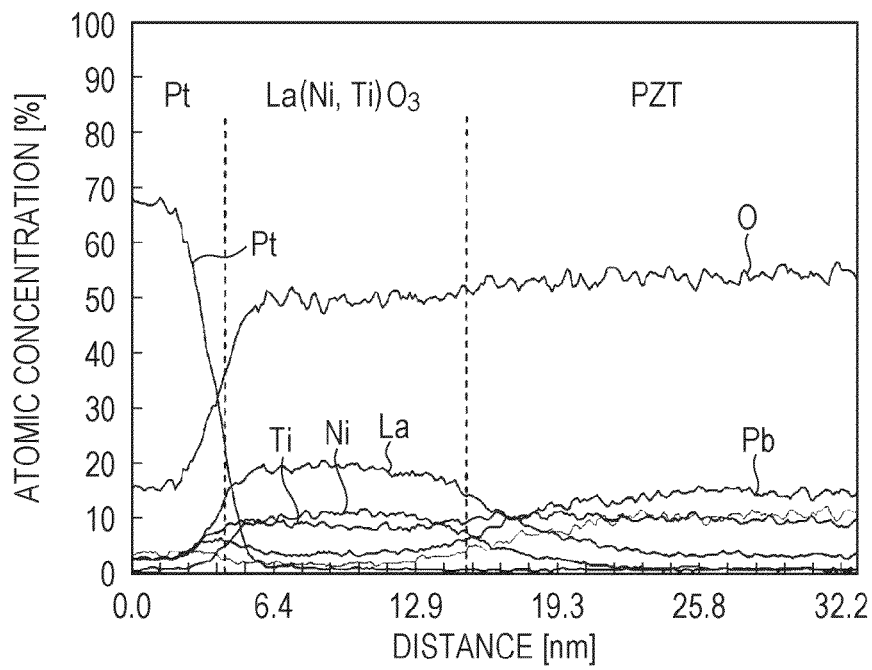
FIGS. 20A and 20B are plots of the results of STEM-EDS analysis around the interface between a piezoelectric layer and an orientation control layer.

The element distribution of the piezoelectric element of Sample 16 was analyzed at the interface between the piezoelectric layer 70 and the orientation control layer 72 by STEM-EDS. This STEM-EDS analysis was performed with Analysis Station JED-2300 (100 mm$^2$ silicon drift (SDD) type) supplied with the atomic resolution analytical electron microscope ARM200F manufactured by JEOL. FIG. 20A shows the results of STEM-EDS analysis across the interface between the piezoelectric layer and the orientation control layer, and FIG. 20B shows a partially enlarged portion of FIG. 20A.

Figure 21:
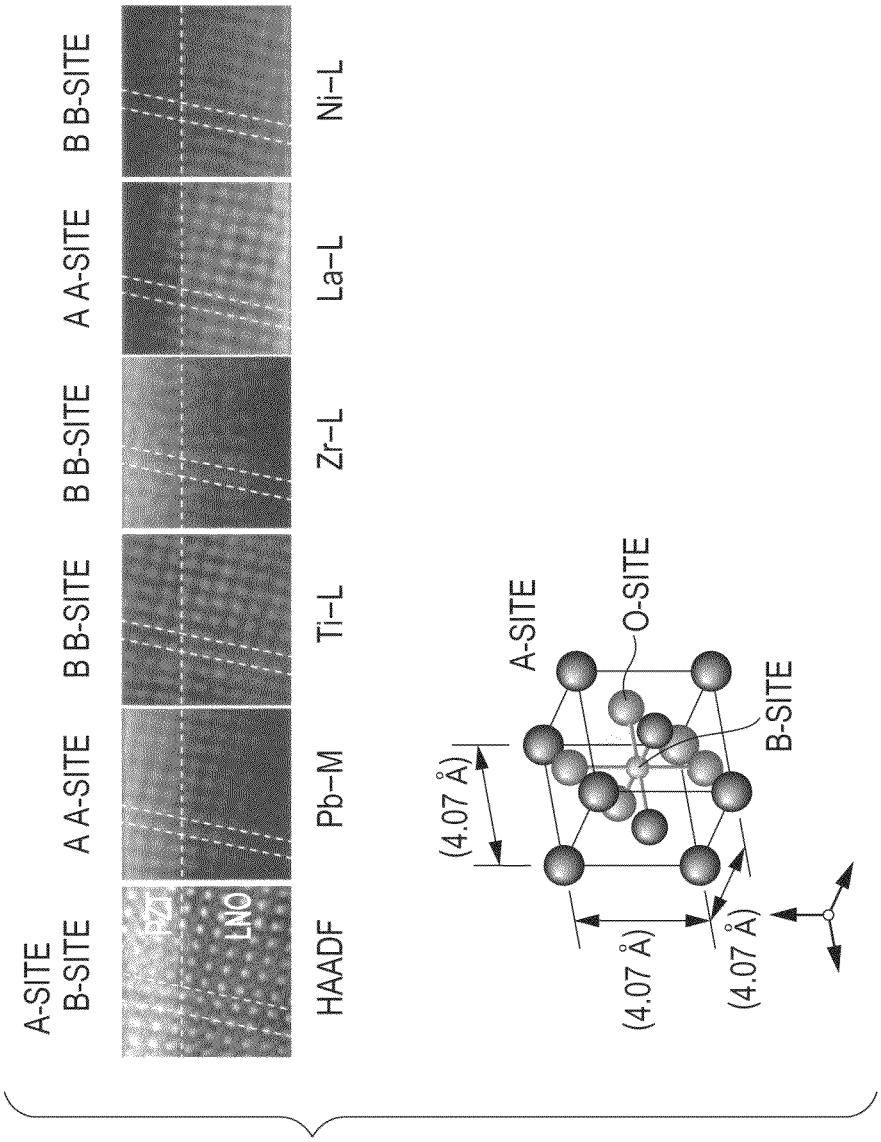
FIG. 21 is a representation of cross-sectional STEM-HAADF images and an atomic column map at the interface between a piezoelectric layer and an orientation control layer.

The cross-sectional STEM-HAADF image across the interface between the piezoelectric layer 70 and the orientation control layer 72 of Sample 16 was observed. FIG. 21 shows cross-sectional STEM-HAADF images and atomic column map.

Figure 20B:
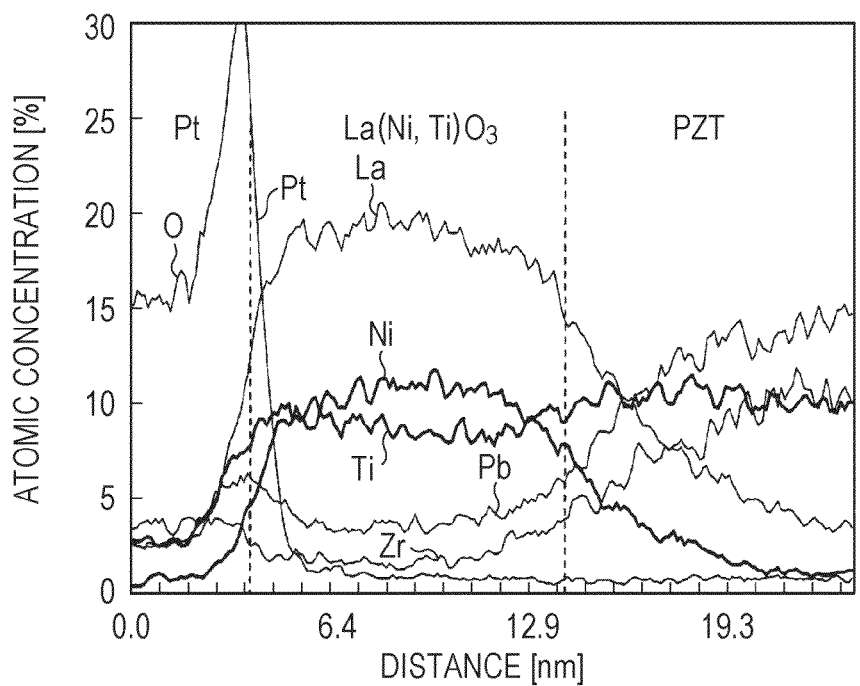

FIGS. 20A and 20B show that in Sample 16, the elements (La, Ni, Ti, Pb, and Zr) in the piezoelectric layer 70 and the orientation control layer 72 are mutually diffused from one layer to the other layer around the interface. In particular, the Ni and Ti in La(Ni, Ti)O$_3$ are present in the B site with 1:1 ratio. This suggests that a considerably large percentage of the Ni in the orientation control layer 72 had been substituted with Ti. Also, the cross-sectional STEM-EDS atomic column map of FIG. 21 shows that the A site of the lanthanum nickelate titanate (La(Ni, Ti)O$_3$) of the orientation control layer 72 is occupied by La and the Pb diffused from the PZT layer, and that its B site is occupied by Ni and the Ti diffused from the PZT layer and the adhesion layer.

OTHER EMBODIMENTS

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Also, although the piezoelectric element 300 of the above embodiment includes the first electrode 60, the piezoelectric layer 70 and the second electrode 80 that are formed in that order on a substrate (flow channel substrate 10), the structure of the piezoelectric element is not limited to this structure. For example, an embodiment of the invention can be applied to a vertical vibration piezoelectric element including layers of a piezoelectric material and an electrode material alternately formed so as to expand and contract in an axis direction.

Figure 22:
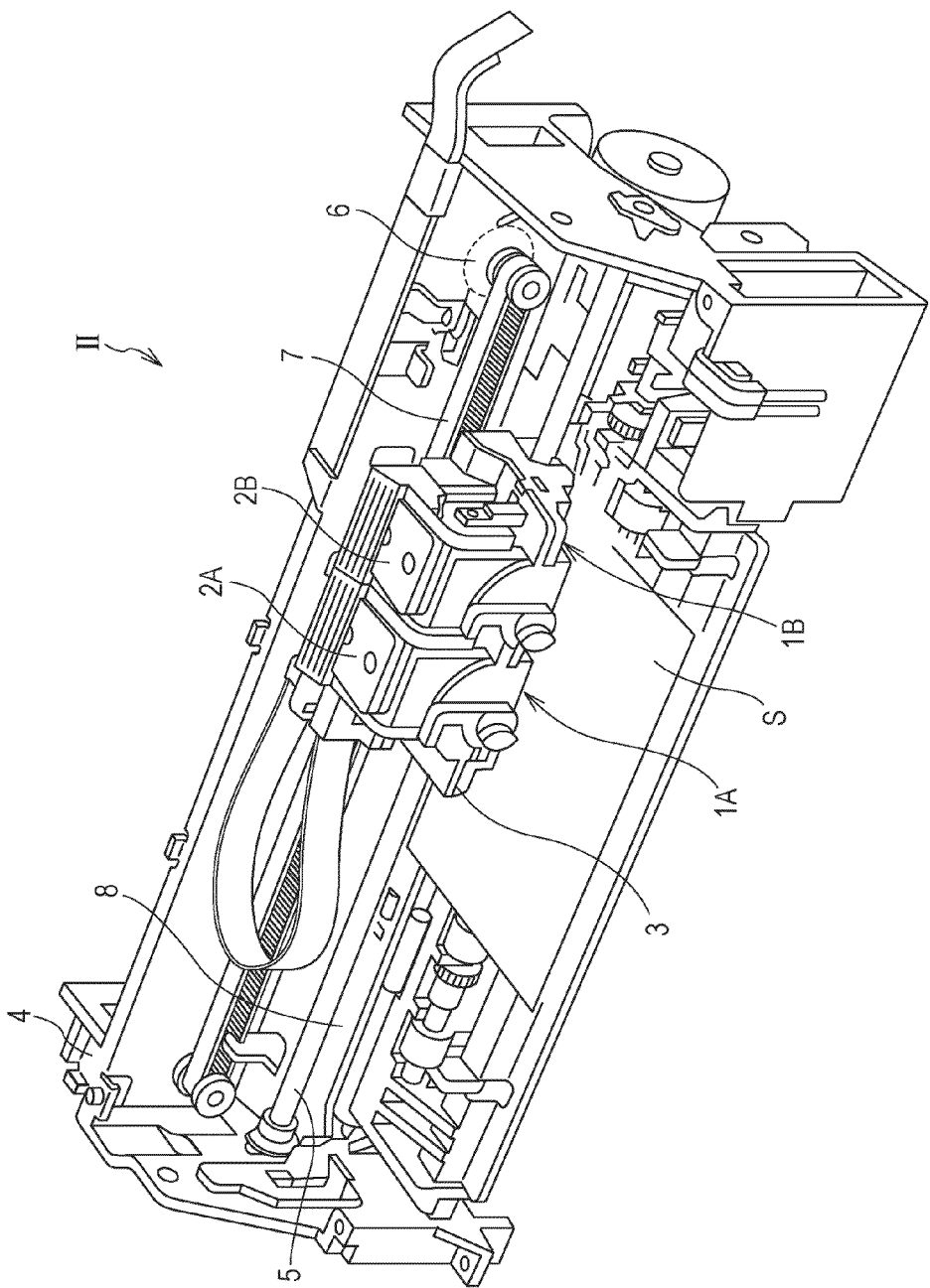
FIG. 22 is a schematic view of a recording apparatus according to an embodiment of the invention.

The ink jet recording head according to an embodiment of the invention can be installed in an ink jet recording apparatus to serve as a part of a recording head unit including ink flow channels communicating with an ink cartridge or the like. FIG. 22 is a schematic perspective view of such an ink jet recording apparatus.

The ink jet recording apparatus II shown in FIG. 22 includes recording head units 1A and 1B each including the ink jet recording head I, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B discharge, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a recording medium such as a paper sheet fed from, for example, a feed roller (not shown), is transported over the platen 8.

Although the above embodiment has described an ink jet recording head as the liquid ejecting head, the invention is intended for any type of liquid ejecting head, and may be applied to other liquid ejecting heads that eject liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

Also, the piezoelectric element according to embodiments of the invention is not limited to the piezoelectric element used for liquid ejecting heads, and can be used in other devices. Examples of such other devices include ultrasonic devices such as an ultrasonic oscillator, an ultrasonic motor, a temperature-electricity converter, a pressure-electricity converter, a ferroelectric transistor, a piezoelectric transformer, and filters, such as a cutoff filter for harmful rays such as infrared radiation, an optical filter using the photonic crystal effect of quantum dot formation, and an optical filter using optical interference of a thin film. The invention is also applied to a piezoelectric element used as a sensor and a piezoelectric element used as a ferroelectric memory. Sensors using a piezoelectric element include, for example, an infrared sensor, a supersonic sensor, a thermal sensor, a pressure sensor, a pyroelectric sensor, and a gyro sensor (angular velocity sensor).

The entire disclosures of Japanese Patent Application Nos. 2013-124135, filed Jun. 12, 2013, and 2014-120023, filed Jun. 10, 2014, are expressly incorporated by reference herein.

What is claimed is:

1. A piezoelectric element comprising:
   a first electrode;
   an orientation control layer overlying the first electrode, the orientation control layer made of a complex oxide having a perovskite structure including an A site containing lanthanum and a B site containing nickel and titanium;

a piezoelectric layer overlying the orientation control layer, the piezoelectric layer made of a complex oxide having a perovskite structure including an A site containing lead and a B site containing zirconium and titanium; and a second electrode overlying the piezoelectric layer.

2. The piezoelectric element according to claim 1, wherein the piezoelectric layer includes a piezoelectric region of 20 nm in thickness from the interface between the piezoelectric layer and the orientation control layer, a mole ratio of the lead in the A site to the zirconium and titanium in the B site of the piezoelectric region is in the range of 0.69 to 0.76.

3. The piezoelectric element according to claim 2, wherein a mole ratio of the zirconium to the titanium in the B site of the piezoelectric region is in the range of 0.25 to 1.50.

4. The piezoelectric element according to claim 1, wherein the piezoelectric layer further includes lanthanum in the A site and nickel in the B site.

5. The piezoelectric element according to claim 4, wherein the piezoelectric layer includes a piezoelectric region of 20 nm in thickness from the interface between the piezoelectric layer and the orientation control layer, a mole ratio of the lead and lanthanum in the A site to the nickel, zirconium and titanium in the B site of the piezoelectric region is in the range of 0.83 to 0.92.

6. The piezoelectric element according to claim 1, wherein a mole ratio of the lanthanum in the A site to the nickel and titanium in the B site of the orientation control layer is in the range of 0.91 to 1.04 while the mole ratio of the nickel to the titanium in the B site thereof is 0.85 to 1.06.

7. The piezoelectric element according to claim 1, wherein the orientation control layer further includes lead in the A site.

8. The piezoelectric element according to claim 7, wherein a mole ratio of the lead and lanthanum in the A site to the nickel and titanium in the B site of the orientation control layer is in the range of 0.90 to 1.14.

9. The piezoelectric element according to claim 1, wherein the first electrode is disposed on a titanium layer.

10. A liquid ejecting head comprising the piezoelectric element as set forth in claim 1.

11. A liquid ejecting apparatus comprising the liquid ejection head as set forth in claim 10.

* * * * *